(12) United States Patent
Tomatsu et al.

(10) Patent No.: US 9,117,701 B2
(45) Date of Patent: Aug. 25, 2015

(54) SEMICONDUCTOR DEVICE

(75) Inventors: Hiroyuki Tomatsu, Kanagawa (JP);
Hidetomo Kobayashi, Kanagawa (JP);
Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 773 days.

(21) Appl. No.: 13/459,537

(22) Filed: Apr. 30, 2012

(65) Prior Publication Data

US 2012/0281469 A1    Nov. 8, 2012

(30) Foreign Application Priority Data

May 6, 2011 (JP) ................................. 2011-103713

(51) Int. Cl.
| G11C 11/00 | (2006.01) |
| G11C 7/00 | (2006.01) |
| H01L 27/115 | (2006.01) |
| G11C 7/02 | (2006.01) |
| G11C 11/408 | (2006.01) |

(Continued)

(52) U.S. Cl.
CPC .............. H01L 27/1156 (2013.01); G11C 7/02 (2013.01); G11C 11/4085 (2013.01); G11C 11/4091 (2013.01); G11C 11/4094 (2013.01)

(58) Field of Classification Search
CPC .. H03K 19/0016; G11C 5/147; G11C 11/406; G11C 11/4074; G11C 11/4096; G11C 2207/005; G11C 7/062; G11C 7/067; G11C 11/405; G11C 11/403; G11C 11/4085; H01L 29/7869; H01L 27/1225
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol—Gel—Derived Zinc Oxide Films by Irradiation With Ultraviolet Lamp," Journal of Sol—Gel Science and Technology, 2003, vol. 26. pp. 181-184.

(Continued)

*Primary Examiner* — Hien Nguyen
(74) *Attorney, Agent, or Firm* — Fish & Richardson P.C.

(57) ABSTRACT

Noise generated on a word line is reduced without increasing a load on the word line. A semiconductor device is provided in which a plurality of storage elements each including at least one switching element are provided in matrix; each of the plurality of storage elements is electrically connected to a word line and a bit line; the word line is connected to a gate (or a source and a drain) of a transistor in which minority carriers do not exist substantially; and capacitance of the transistor in which minority carriers do not exist substantially can be controlled by controlling a potential of a source and a drain (or a gate) the transistor in which minority carriers do not exist substantially. The transistor in which minority carriers do not exist substantially may include a wide band gap semiconductor.

30 Claims, 15 Drawing Sheets

(51) Int. Cl.
  *G11C 11/4091* (2006.01)
  *G11C 11/4094* (2006.01)

(56) References Cited

U.S. PATENT DOCUMENTS

| | | | |
|---|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0063205 A1 | 3/2012 | Matsuzaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

(56) References Cited

OTHER PUBLICATIONS

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5). InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Tin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors." Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)_m$ (m<4):a $Zn4s$ conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED." AM-FPD '08 Digest of Technical Papers, Jul. 2, 2008, pp. 275-278.

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

GROUP

● In
☾ Sn
☾ Zn
● O

GROUP

● In
○ Ga
○ Zn
● O

SEMICONDUCTOR DEVICE

BACKGROUND OF THE INVENTION

1. Field of the Invention

The present invention relates to a semiconductor device. In this specification, a semiconductor device refers to a semiconductor element itself or a device including a semiconductor element. As such a semiconductor element, a thin film transistor is given, for example. Accordingly, the semiconductor device includes liquid crystal display devices, memory devices, and the like.

2. Description of the Related Art

As one kind of a volatile memory, a dynamic random access memory (DRAM) is widely known.

On the other hand, in recent years, metal oxides having semiconductor characteristics (hereinafter, referred to as oxide semiconductors) have attracted attention. Oxide semiconductors can be applied to transistors (see Patent Documents 1 and 2).

REFERENCE

[Patent Document 1] Japanese Published Patent Application No. 2007-123861

[Patent Document 2] Japanese Published Patent Application No. 2007-096055

SUMMARY OF THE INVENTION

In memory devices typified by DRAM, a plurality of elements are provided in matrix and electrically connected to bit lines and word lines. The bit lines and the word lines are provided in columns and rows, and thus, intersect with each other. In this case, parasitic capacitance is generated at the intersections of these lines, which generates noise on the word line.

A possible way to prevent such noise from occurring is to electrically connect a capacitor to the word line. However, the electrical connection of the capacitor to the word line increases a load on the word line, leading to signal delay.

An object of one embodiment of the present invention is to reduce noise on a word line without increasing a load on the word line.

One embodiment of the present invention is a semiconductor device in which a plurality of storage elements each including at least one switching element are provided in matrix, each of the storage elements is electrically connected to a word line and a bit line, the word line is electrically connected to a gate of a transistor in which a minority carrier does not exist substantially, and a capacitance of the transistor in which a minority carrier does not exist substantially is controlled by controlling potentials of a source and a drain of the transistor in which a minority carrier does not exist substantially.

One embodiment of the present invention is a semiconductor device in which a plurality of storage elements each including at least one switching element are provided in matrix, each of the storage elements is electrically connected to a word line and a bit line, the word line is electrically connected to a source and a drain of a transistor in which a minority carrier does not exist substantially, and a capacitance of the transistor in which a minority carrier does not exist substantially is controlled by controlling a potential of a gate of the transistor in which a minority carrier does not exist substantially.

One embodiment of the present invention is a semiconductor device in which a plurality of storage elements each including at least one switching element are provided in matrix, each of the storage elements is electrically connected to a word line and a bit line, the word line is electrically connected to a gate of a wide band gap semiconductor transistor, and a capacitance of the wide band gap semiconductor transistor is controlled by controlling potentials of a source and a drain of the wide band gap semiconductor transistor.

One embodiment of the present invention is a semiconductor device in which a plurality of storage elements each including at least one switching element are provided in matrix, each of the storage elements is electrically connected to a word line and a bit line, the word line is electrically connected to a source and a drain of a wide band gap semiconductor transistor, and a capacitance of the wide band gap semiconductor transistor is controlled by controlling a potential of a gate of the wide band gap semiconductor transistor.

According to the semiconductor device having the above structure, the wide band gap semiconductor transistor preferably includes a semiconductor material whose band gap is larger than or equal to 2.0 eV and smaller than or equal to 3.5 eV in a channel formation region.

According to the semiconductor device having the above structure, the transistor in which minority carrier does not exist substantially or the wide band gap semiconductor transistor includes an oxide semiconductor in a channel formation region.

According to the semiconductor device having the above structure, it is preferable that the bit line be electrically connected to a precharging and amplification circuit including a sense amplifier, and the sense amplifier be set as the middle to provide the equal numbers of the plurality of storage elements along the bit line. This is because when data are read from the storage elements, it is possible to drive the semiconductor device to obtain a difference between the equal numbers of the storage elements with the sense amplifier provided.

According to the semiconductor device having the above structure, sources and drains of the transistor in which a minority carrier does not exist substantially or the wide band gap semiconductor transistor are preferably connected to not only each other but also a drain and a source of adjacent wide band gap semiconductor transistors with the wiring layer along the word line. This is because even when characteristics of the wide band gap semiconductor transistors are varied through manufacturing steps, variation in characteristics the transistor is prevented from affecting operations of the storage elements at least along the word line.

Note that in this specification, a "wide band gap semiconductor transistor" includes a semiconductor material with wide band gap (2.0 eV to 3.5 eV) in a channel formation region and can be regarded as not having minority carriers substantially (a transistor in which minority carriers do not exist substantially). A semiconductor material used for such a "wide band gap semiconductor transistor" can be a compound semiconductor such as silicon carbide or a gallium nitride, an oxide semiconductor such as a zinc oxide, or the like, which has a lower intrinsic carrier densities than silicon. For example, in a transistor including an oxide semiconductor in a channel formation region (also referred to as an OS transistor), the density of the minority carriers is low and the minority carriers are difficult to be induced, and therefore, a tunnel current in the OS transistor is hardly generated and an off-state current is low.

Note that a wide band gap semiconductor transistor in the drawings is partly drawn by a dotted line to indicate that an off-state current is extremely low.

Note that in this specification, "atoms" or "molecules" may be ionized atoms or molecules.

According to one embodiment of the present invention, noise on a word line can be reduced without increasing a load on the word line.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

First, a configuration example of a memory device according to an embodiment of the present invention is described.

Figure 1:
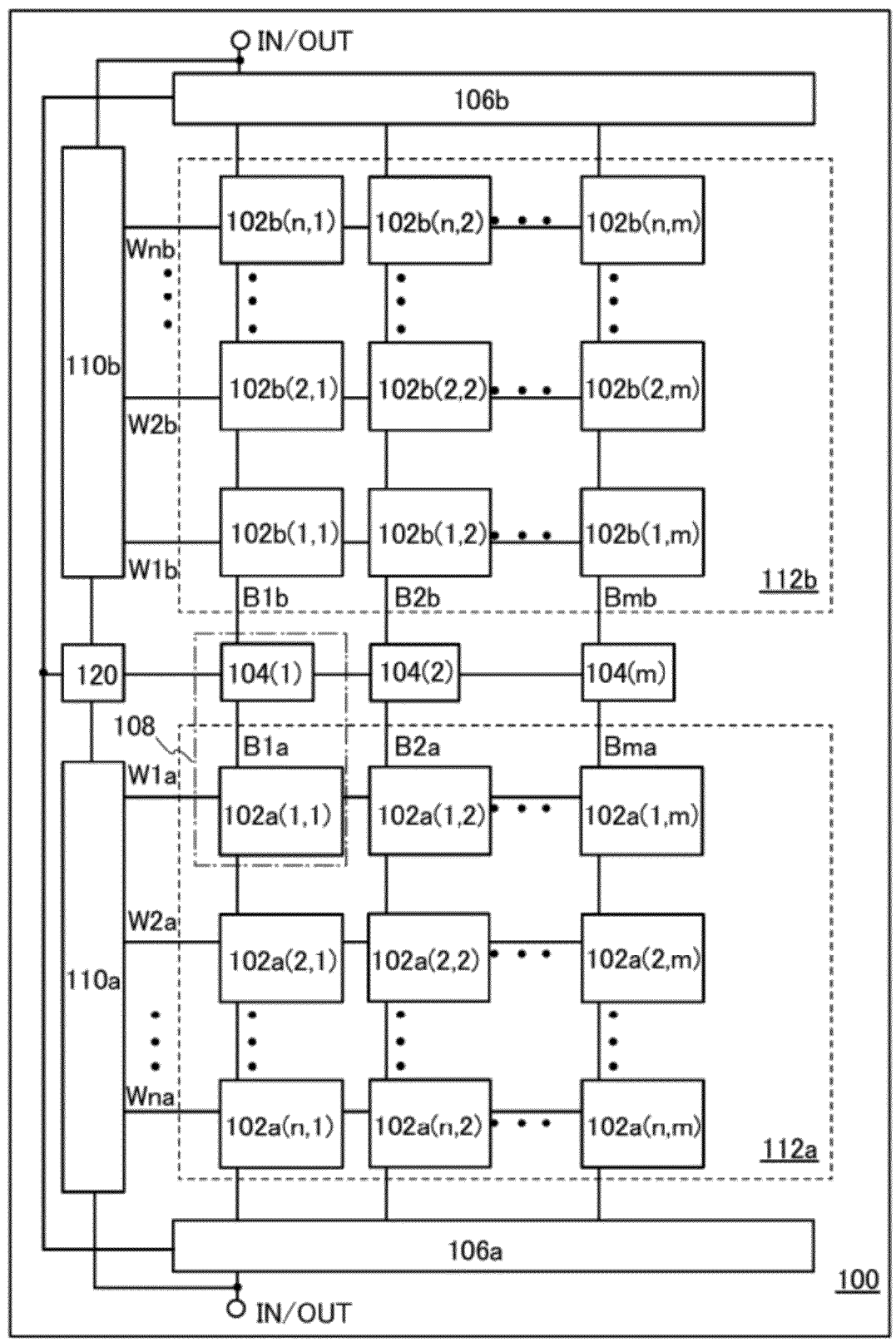
FIG. 1 illustrates a semiconductor device which is one embodiment of the present invention.

A memory device 100 illustrated in FIG. 1 includes a first column decoder 106a, a second column decoder 106b, a first row decoder 110a, a second row decoder 110b, a signal generation circuit 120, a first region 112a, and a second region 112b.

The first column decoder 106a and the second column decoder 106b are decoder circuits for controlling signals input to bit lines. The first column decoder 106a and the second column decoder 106b are electrically connected to external input/output terminals (terminals denoted by IN/OUT in the drawings).

Note that the first column decoder 106a and the second column decoder 106b each include a switch for inputting/outputting data and selecting the bit line.

The first row decoder 110a and the second row decoder 110b are decoder circuits for controlling signals input to word lines. The first row decoder 110a and the second row decoder 110b are electrically connected to the external input/output terminals (terminals denoted by IN/OUT in the drawings).

The signal generation circuit 120 generates signals input to at least a precharging and amplification circuits 104($l$) to 104($m$), the first column decoder 106a, and the second column decoder 106b. The signals generated here are named a CLE (column line enable) signal, an SAE (sense amplifier enable) signal, a PRE (precharge enable) signal, a CON (control) signal, and the like. The CON signal input to the first region 112a is referred to as a CONa signal. The CON signal input to the second region 112b is referred to as a CONb signal. Note that m is a natural number larger than or equal to 1.

The first region 112a and the second region 112b are each provided with n×m storage elements arranged in matrix. Accordingly, the memory device 100 is provided with 2n×m storage elements arranged in matrix. Note that n is a natural number larger than or equal to 1.

A storage element 102a (x, y) and a storage element 102b (x, y) each have a function of storing data and a circuit needed for operation. Each of the storage element 102a (x, y) and the storage element 102b (x, y) may be formed using a plurality of elements. Note that x is a natural number smaller than or equal to n and y is a natural number smaller than or equal to m.

That is, n×m storage elements 102a are provided in the region 112a and n×m storage elements 102b are also provided in the region 112b. A preferable way of arrangement is to arrange equal numbers of the storage elements 102a and the storage elements 102b along the bit lines, and the precharging and amplification circuits 104($l$) to 104($m$) each including a sense amplifier 122 are preferably provided between the storage elements 102a and the storage elements 102b. This is because when data are read from the storage elements 102a and the storage elements 102b, it is possible to drive the semiconductor device to obtain a difference between the equal numbers of the storage elements 102a and the storage elements 102b with the sense amplifier 122 provided therebetween.

The storage element 102a (x, y) is electrically connected to the first column decoder 106a through the bit line and to the first row decoder 110a through the word line. This means that, for example, the storage element 102a (k, l) is electrically connected to the first column decoder 106a through the bit line Bla and to the first row decoder 110a through the word line Wka. Note that k is a natural number larger than or equal to 1 and l is a natural number larger than or equal to 1.

The storage element 102b (x, y) is electrically connected to the second column decoder 106b through the bit line and to the second row decoder 110b through the word line. This means that, for example, the storage element 102b (k, l) is electrically connected to the second column decoder 106b through the bit line Blb and to the second row decoder 110b through the word line Wkb.

Next, attention is paid to part of the configuration in FIG. 1, and the storage element 102a (1, 1) and the precharging and amplification circuit 104($l$) are described in detail with reference to FIG. 2. Note that a configuration shown in FIG. 2 is just an example and a storage element of another mode may also be used.

Figure 2:
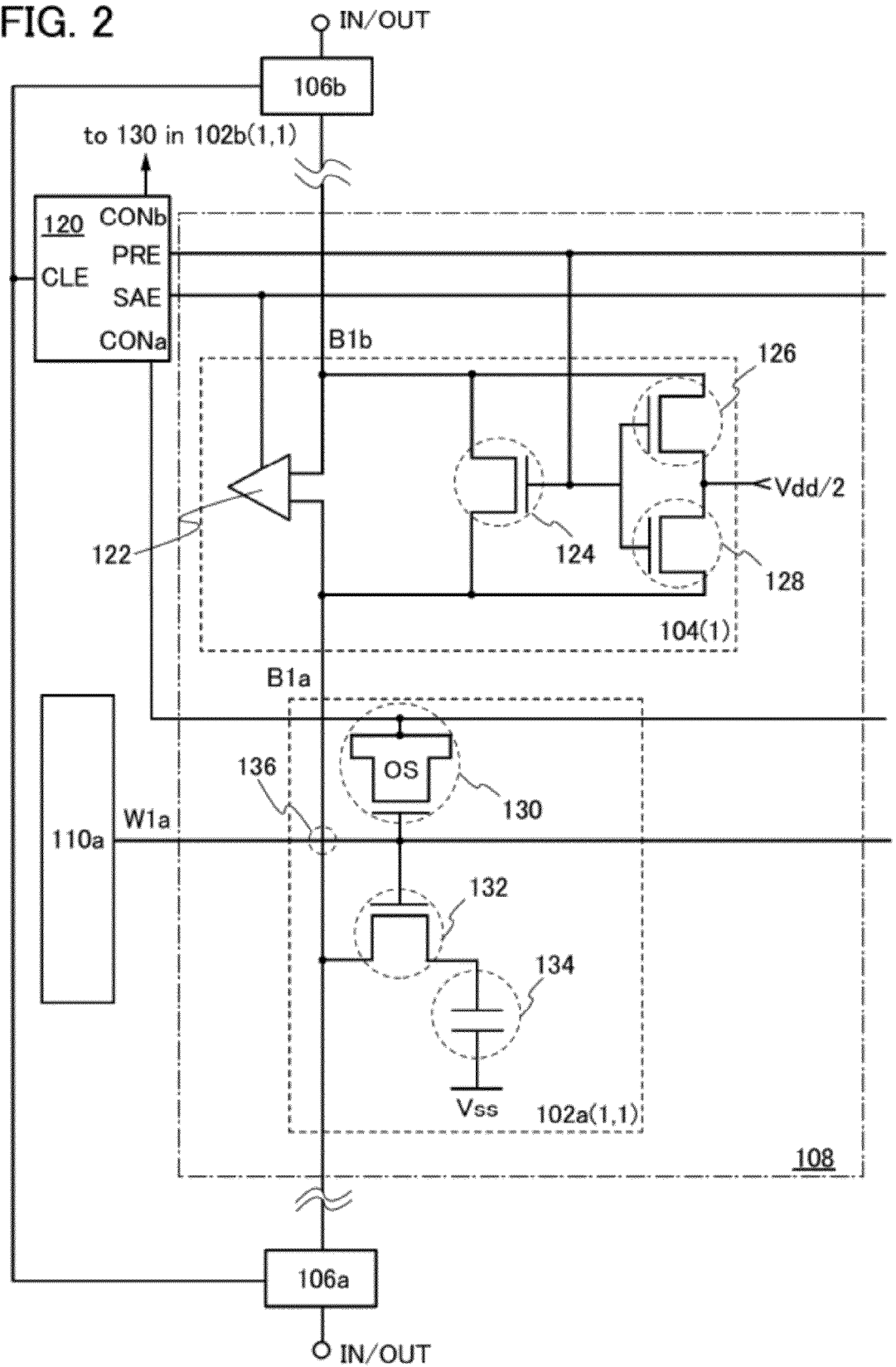
FIG. 2 illustrates a part of FIG. 1.

FIG. 2 illustrates the detail of a region 108 in FIG. 1.

The region 108 includes the storage element 102a (1, 1) and the precharging and amplification circuit 104(l).

The storage element 102a (1, 1) includes a wide band gap semiconductor transistor 130, a transistor 132, and a capacitor 134. Further, the storage element 102a (1, 1) is electrically connected to the bit line B1a and the word line W1a.

In the storage element 102a (1, 1), the word line W1a is electrically connected to a gate of the wide band gap semiconductor transistor 130 and a gate of the transistor 132; the bit line B1a is electrically connected to one of a source and a drain of the transistor 132; the other of the source and the drain of the transistor 132 is electrically connected to a low-potential (Vss) power supply potential line through the capacitor 134; and a source and a drain of the wide band gap semiconductor transistor 130 are electrically connected to the signal generation circuit 120. Note that electric charge is held between the transistor 132 and the capacitor 134. Here, the signal generation circuit 120 inputs the CONa signal which is a control signal.

An example of the wide band gap semiconductor transistor 130 is a transistor including an oxide semiconductor in a channel formation region (OS transistor).

Note that the gate of the wide band gap semiconductor transistor 130 may be electrically connected to the signal generation circuit 120 and the source and the drain of the wide band gap semiconductor transistor 130 may be electrically connected to the gate of the transistor 132. However, as described below, in the case where the wide band gap semiconductor transistor 130 and the transistor 132 are manufactured in the same step, a more preferable configuration than the above is that the source and the drain of the wide band gap semiconductor transistor 130 are electrically connected to the signal generation circuit 120, and the gate of the wide band gap semiconductor transistor 130 is electrically connected to the gate of the transistor 132. This is because the configuration is in no need of processes to electrically connect the gate of the transistor 132 to the source and the drain of the wide band gap semiconductor transistor 130 (e.g., formation of a contact hole for physically connecting them).

The transistor 132 is an n-channel transistor here, but preferably, a transistor having a low off-state current. This is because, in this case, electric charge can be held for a long time between the transistor 132 and the capacitor 134. An example of the transistor having a low off-state current is an OS transistor.

The capacitor 134 can have any structure as long as an insulating layer is sandwiched between two conductive layers. For example, in the case where the transistor 132 is a thin film transistor, a gate insulating film may be sandwiched between an electrode functioning as the gate of the transistor 132 and an electrode functioning as the source or the drain of the transistor 132.

Note that the configuration of the storage element 102a (1, 1) is the same as that of typical DRAM, except for the wide band gap semiconductor transistor 130. In addition, the transistor 132 may be a wide band gap semiconductor transistor.

The precharging and amplification circuit 104(l) includes the sense amplifier 122, a transistor 124, a transistor 126, and a transistor 128.

In the precharging and amplification circuit 104(l), the sense amplifier 122 is electrically connected to the signal generation circuit 120, the bit line B1a, and the bit line B1b; the bit line B1a is electrically connected to one of a source and a drain of the transistor 124 and one of a source and a drain of the transistor 128; the bit line B1b is electrically connected to the other of the source and the drain of the transistor 124 and one of a source and a drain of the transistor 126; a wiring for supplying a potential of Vdd/2 is electrically connected to the other of the source and the drain of the transistor 126 and the other of the source and the drain of the transistor 128; and gates of the transistor 124, the transistor 126, and the transistor 128 are electrically connected to the signal generation circuit 120. Here, the SAE signal is input from the signal generation circuit 120 to the sense amplifier 122, and the PRE signal is input from the signal generation circuit 120 to the gates of the transistor 124, the transistor 126, and the transistor 128.

Note that as the PRE signal and the SAE signal, the same signals are input to all of the plurality of precharging and amplification circuits 104(l) to 104(m).

The sense amplifier 122 is a circuit which amplifies a voltage supplied from the storage element 102a. The sense amplifier 122 can be either a differential amplifier or a latch amplifier. Here, a latch amplifier in which the same terminal is used for input and output is used as the sense amplifier as an example.

The transistor 124, the transistor 126, and the transistor 128 are n-channel transistors here. Each of the transistor 124, the transistor 126, and the transistor 128 is preferably a transistor having a low off-state current in order that the bit line B1a and the bit line B1b be completely in a floating state when the PRE signal is not input. An example of the transistor having a low off-state current is an OS transistor.

Note that the signal generation circuit 120 is electrically connected to the first column decoder 106a and the second column decoder 106b. The signal generation circuit 120 inputs the CLE signal to the first column decoder 106a and the second column decoder 106b.

Note that the signal generation circuit 120, as illustrated in FIG. 1, may be electrically connected to the first row decoder 110a and the second row decoder 110b. However, the connection is omitted in FIG. 2 for simple explanation.

Note that the external input/output terminals (terminals denoted by IN/OUT in the drawings), as illustrated in FIG. 1, may also be electrically connected to the first row decoder 110a and the second row decoder 110b. However, the connection is omitted in FIG. 2 for simple explanation.

Here, attention is focused on a parasitic capacitance region 136 where the bit line intersects with the word line. Intersection of the bit line and the word line leads to generation of noise on the word line. When noise is generated on the word line, the unselected storage element 102a is selected because of the noise; thus, data are read wrongly. Further, when the noise is a high voltage, data stored in the storage element might be destroyed.

A possible way to prevent such noise from propagating is to electrically connect a capacitor to the word line. However, when the word line is electrically connected to a capacitor (e.g., the capacitor 134), a load on the word line is increased at the time of signal transmission, leading to signal delay.

Here, the capacitor electrically connected to the word line is a variable capacitor which functions as a capacitor at the time of noise propagation and does not function as a capacitor at the time of signal transmission. Note that the structure of the capacitor is not limited thereto.

Thus, in one embodiment of the present invention, the gate of the wide band gap semiconductor transistor 130 is electrically connected to the word line. The gate of the wide band gap semiconductor transistor 130 is electrically connected to the word line, and the source and the drain of the wide band gap semiconductor transistor 130 are electrically connected to the signal generation circuit 120. The signal generation circuit 120 inputs a control signal (CONa) to the source and the drain of the wide band gap semiconductor transistor 130.

Such a configuration makes the following operation possible: in the case where noise is generated on the word line, the wide band gap semiconductor transistor 130 serves as a capacitor by inputting no control signal (CONa) (or by inputting an L-level signal), and in the case where a signal is transmitted through the word line, the wide band gap semiconductor transistor 130 is not driven as a capacitor by inputting the control signal (CONa) (or by inputting an H-level signal).

Such a configuration is achieved by using a wide band gap semiconductor transistor as a transistor functioning as a capacitor. In the case of using a transistor including silicon in a channel formation region (Si transistor) instead of the wide band gap semiconductor transistor, minority carriers are accumulated in its channel formation region when the control signal (CONa) is not input (or an L-level signal is input); that is, the Si transistor provided instead of the wide band gap semiconductor transistor 130 cannot sufficiently function as a capacitor. Accordingly, in that case, the transistor electrically connected to the word line cannot be prevented from functioning as a capacitor at the time of signal transmission, so that a load on the word line is increased at the time of signal transmission, leading to signal delay.

An example of the wide band gap semiconductor transistor 130 is an OS transistor.

Note that as described above, the transistor 132 is preferably a transistor having a low off-state current. An example of the transistor having a low off-state current is an OS transistor. Accordingly, each of the wide band gap semiconductor transistor 130 and the transistor 132 is preferably an OS transistor. This is because the wide band gap semiconductor transistor 130 and the transistor 132 can be manufactured in the same step in the same storage element.

Note that the bit line B1a and the bit line B1b are electrically connected to the precharging and amplification circuits 104(l) to 104(m) each including the sense amplifier 122. It is preferable that the number of the storage elements 102a provided along the bit line B1a extending from the sense amplifier 122 be equal to the number of the storage elements 102b provided along the bit line B1b extending from the sense amplifier 122. In order to read data from the storage elements 102a and 102b, the sense amplifier 122 is set as the middle and a difference between data of the storage elements provided along the bit line B1a and data of the storage elements provided along the bit line B1b is obtained.

Note that the source and the drain of the wide band gap semiconductor transistor 130 are preferably connected to not only each other but also a drain and a source of adjacent wide band gap semiconductor transistors with the wiring layer 216 along the word line W1a. This is because even when characteristics of the wide band gap semiconductor transistors 130 are varied at the time of manufacture, variation in characteristics of the wide band gap semiconductor transistor 130 is prevented from affecting operations of the storage elements 102a at least along the word line W1a. Note that the wide band gap semiconductor transistor 130 is not necessarily provided in each of all of the storage elements 102a and 102b.

Figure 3:
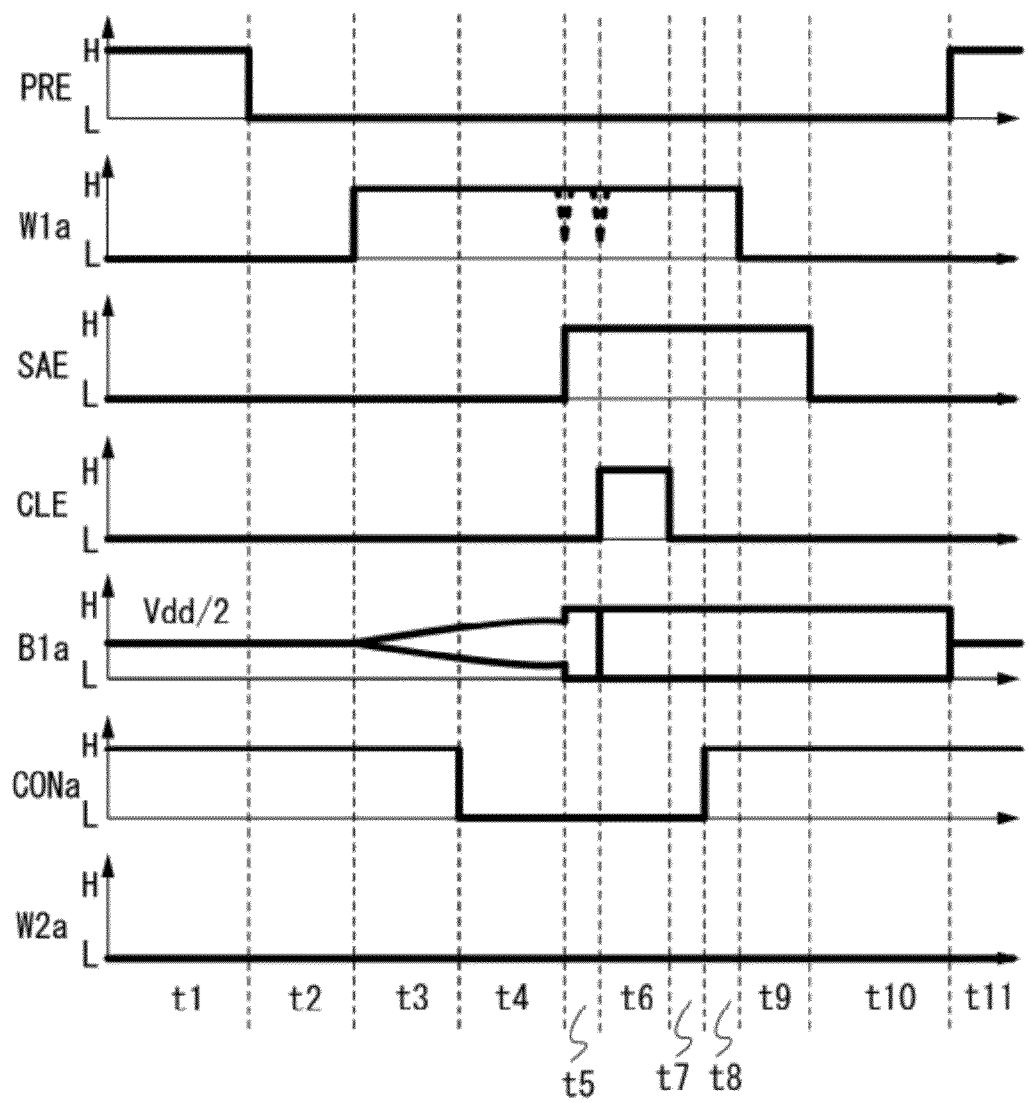
FIG. 3 is a timing diagram illustrating an operation of the configuration in FIG. 2.

FIG. 3 is a timing diagram for illustrating operation of the device illustrated in FIG. 2. The operation in the case where electric charge is held between the transistor 132 and the capacitor 134 is described.

First, the CONa signal at an H level and the PRE signal at an H level are input (a period t1). By inputting the CONa signal at the H level, the wide band gap semiconductor transistor 130 does not function as a capacitor. When the PRE signal at the H level is input, the potential of the bit line B1a becomes Vdd/2.

Next, input of the PRE signal at the H level is stopped and the PRE signal becomes an L level (a period t2). The PRE signal at the L level brings the bit line B1a into a floating state. Here, the potential of the bit line B1a is maintained at Vdd/2.

Then, an H-level signal is input to the word line W1a (a period t3). Input of the H-level signal to the word line W1a turns the transistor 132 on. Here, the wide band gap semiconductor transistor 130 does not function as a capacitor, and therefore, signal transmission delay through the word line W1a due to the wide band gap semiconductor transistor 130 does not occur. Electric charge between the transistor 132 and the capacitor 134 makes the potential of the bit line B1a gradually higher or lower.

Next, input of the CONa signal at the H level is stopped and the CONa signal becomes the L level (a period t4). Thus, the wide band gap semiconductor transistor 130 functions as a capacitor.

Then, the SAE signal at an H level is input (a period t5). Input of the SAE signal at the H level makes the sense amplifier 122 operate so that the potential of the bit line B1a is constant (high potential or low potential). At that time, capacitive coupling between the bit line B1a and the word line W1a causes noise (shown by a dotted line). However, the wide band gap semiconductor transistor 130 functions as a capacitor (there is a difference between the potential of the word line W1a and the potential of the control signal CONa); therefore, propagation of noise is kept at a minimum.

After that, the CLE signal at an H level is input (a period t6). By inputting the CLE signal at the H level, writing data are input from the external input/output terminal (IN/OUT) to the bit line B1a; accordingly, the potential of the bit line B1a becomes the potential of the writing data. In addition, electric charge corresponding to the potential of the writing data is accumulated between the transistor 132 and the capacitor 134. Here, in the case where the constant potential in the period t5 is different from the potential of the writing data, capacitive coupling between the bit line B1a and the word line W1a causes noise (shown by a dotted line). However, the wide band gap semiconductor transistor 130 functions as a capacitor; therefore, propagation of noise is kept at a minimum.

Then, input of the CLE signal at the H level is stopped and the CLE signal becomes the L level (a period t7). The CLE signal at the L level brings the bit line B1a into a floating state.

The CONa signal at the H level is input (a period t8). The wide band gap semiconductor transistor 130 is stopped functioning as a capacitor.

After that, an H-level signal input to the word line W1a is stopped and becomes at an L level (a period t9). When an L-level signal is input to the word line W1a, the transistor 132 is turned off. Here, the wide band gap semiconductor transistor 130 does not function as a capacitor, and therefore, signal transmission delay through the word line W1a due to the wide band gap semiconductor transistor 130 does not occur.

Then, supply of the SAE signal at an H level is stopped and become an L level (a period t10). Input of the SAE signal at the L level stops operation of the sense amplifier 122.

In addition, the PRE signal at the H level is input (a period t11). When the PRE signal at the H level is input, the potential of the bit line B1a becomes Vdd/2.

Figure 4:
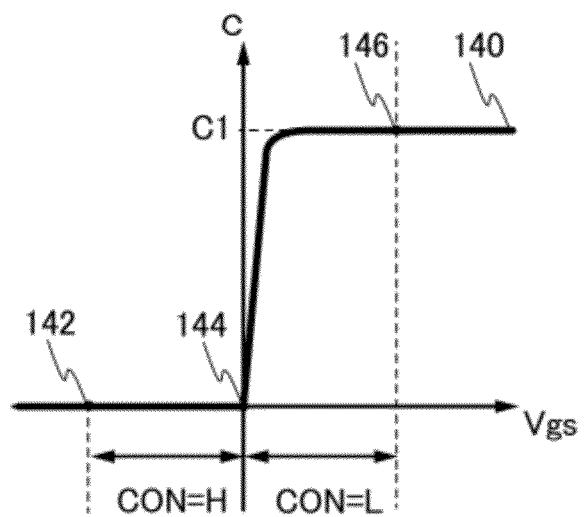
FIG. 4 illustrates an operation of a wide band gap semiconductor transistor 130 in FIG. 2.

Here, with reference to FIG. 4, the case where the wide band gap semiconductor transistor 130 functions as a capacitor and the case where the wide band gap semiconductor transistor 130 does not function as a capacitor are described.

FIG. 4 shows a relation between a gate voltage $V_{gs}$ of the wide band gap semiconductor transistor 130 and a capacitance C of the wide band gap semiconductor transistor 130 when functioning as a capacitor. The capacitance C is changed as shown by a curve 140 depending on the gate voltage $V_{gs}$ of the wide band gap semiconductor transistor 130. Note that the gate voltage $V_{gs}$ is a potential difference between the potential of a gate and the potential of a source when the potential of the source is used as a reference potential.

First, the case where the CONa signal is at the H level is described.

In the case where the potential of the word line W1a is at the L level when the CONa signal is at the H level, $V_{gs}$ of the wide band gap semiconductor transistor 130 is lower than 0. Accordingly, a value at a point 142 on the curve 140 is the capacitance of the wide band gap semiconductor transistor 130 when functioning as a capacitor. At that time, the capacitance C of the wide band gap semiconductor transistor 130 is substantially 0.

In the case where the potential of the word line W1a is at the H level when the CONa signal is at the H level, $V_{gs}$ of the wide band gap semiconductor transistor 130 is equal to 0. Accordingly, a value at a point 144 on the curve 140 is the capacitance of the wide band gap semiconductor transistor 130 when functioning as a capacitor. At that time, the capacitance C of the wide band gap semiconductor transistor 130 is substantially 0.

Next, the case where the CONa signal is at the L level is described.

In the case where the potential of the word line W1a is at the L level when the CONa signal is at the L level, $V_{gs}$ of the wide band gap semiconductor transistor 130 is equal to 0. Accordingly, a value of the point 144 on the curve 140 is the capacitance of the wide band gap semiconductor transistor 130 when functioning as a capacitor. At that time, the capacitance C of the wide band gap semiconductor transistor 130 is substantially 0.

In the case where the potential of the word line W1a is at the H level when the CONa signal is at the L level, $V_{gs}$ of the wide band gap semiconductor transistor 130 is higher than 0. Accordingly, a value at a point 146 on the curve 140 is the capacitance of the wide band gap semiconductor transistor 130 when functioning as a capacitor. At that time, the capacitance C of the wide band gap semiconductor transistor 130 is substantially C1.

Accordingly, only when the CONa signal is at the L level and the potential of the word line W1a is at the H level, the wide band gap semiconductor transistor 130 has capacitance. That is, the wide band gap semiconductor transistor 130 functions as a capacitor. Therefore, the wide band gap semiconductor transistor 130 functions as a capacitor in the periods t3 to t7 in FIG. 3.

Note that in the present invention, a transistor can have variety of structures and is not particularly limited. Accordingly, a transistor may be a transistor including polycrystalline silicon or a transistor formed using an SOI (silicon on insulator) substrate.

Note that in the above description, a transistor is an n-channel transistor but is not limited thereto. A p-channel transistor may be used as appropriate.

Next, a transistor which can be applied to the present invention is described. An example of the wide band gap semiconductor transistor is a transistor including a metal oxide showing semiconductor characteristics in a channel formation region. As a transistor other than a wide band gap semiconductor transistor, a transistor formed using a semiconductor substrate can be given.

Figure 5:
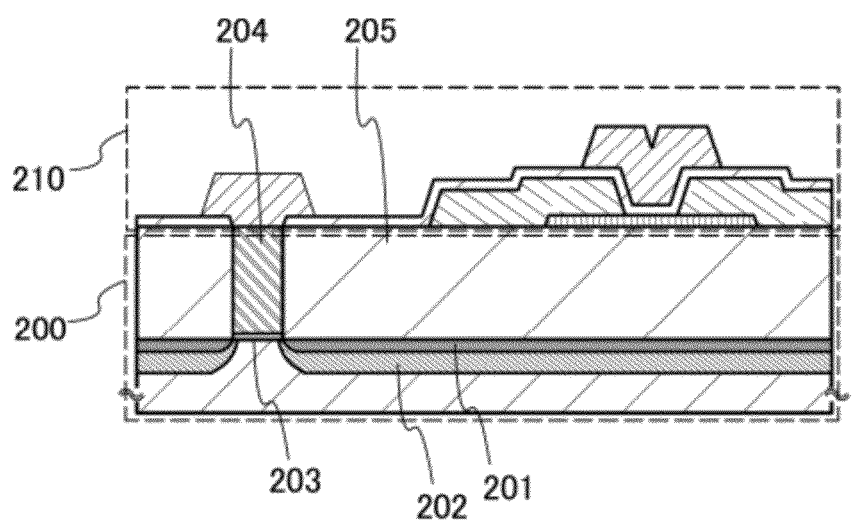
FIG. 5 is a schematic cross-sectional view of a transistor which can be used.

FIG. 5 illustrates an example of a schematic cross-sectional structure of a transistor which can be applied to the present invention. In FIG. 5, a wide band gap semiconductor transistor is formed over a transistor formed using a semiconductor substrate. A transistor formed using a semiconductor substrate may include both of or only one of a p-channel transistor and an n-channel transistor.

A p-channel transistor and an n-channel transistor each of which is formed using a semiconductor substrate may be formed by a general method. After a p-channel transistor formed using a semiconductor substrate and an n-channel transistor formed using the semiconductor substrate are formed, a wide band gap semiconductor transistor is formed thereover. That is to say, a semiconductor substrate 200 in which a p-channel transistor and an n-channel transistor are provided is used as a formation substrate, and then, a wide band gap semiconductor transistor is formed over the substrate. An example of the wide band gap semiconductor transistor is an OS transistor.

Note that the semiconductor substrate 200 in which the p-channel transistor and the n-channel transistor are provided includes a heavily doped impurity region 201 functioning as a source region or a drain region, a lightly doped impurity region 202, a gate insulating film 203, a gate electrode 204, and an interlayer insulating film 205 (FIG. 5).

Figure 6A:
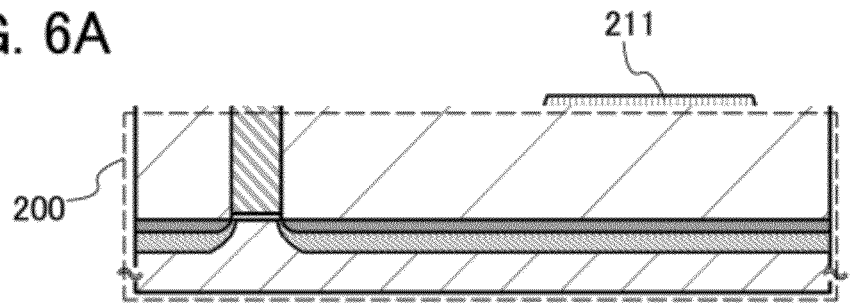
FIGS. 6A to 6D illustrate a method for manufacturing the transistor illustrated in FIG. 5.
Figure 6B:
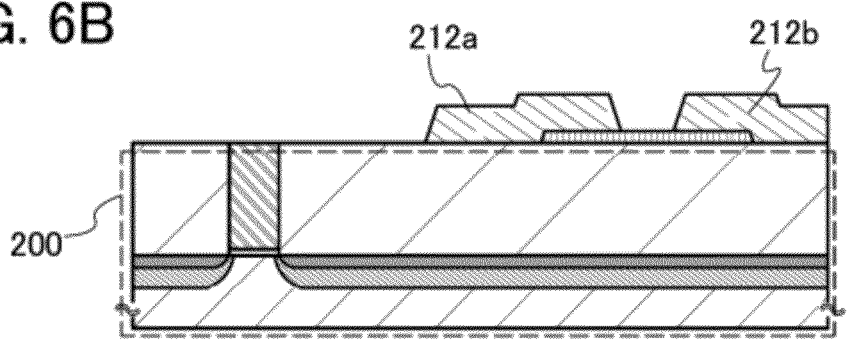
Figure 6C:
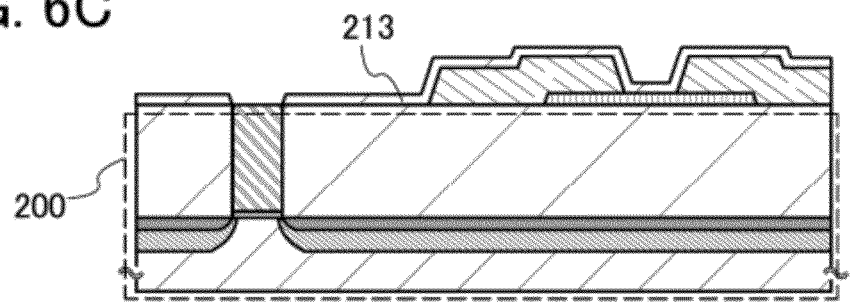
Figure 6D:
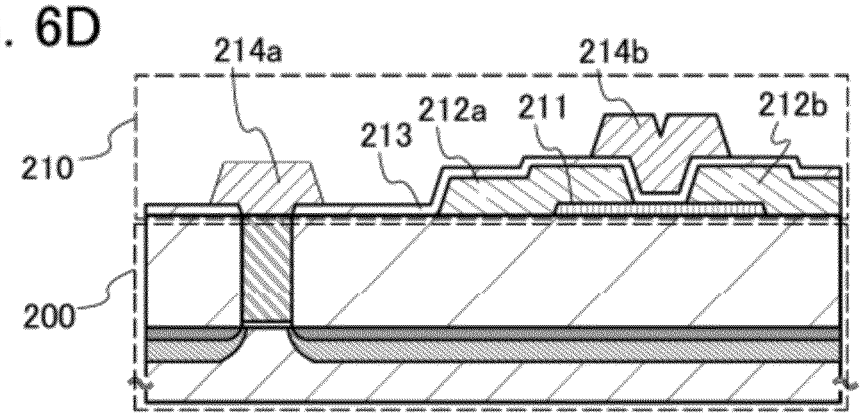

An OS transistor 210 includes an oxide semiconductor layer 211 provided over the semiconductor substrate 200 in which the p-channel transistor and the n-channel transistor are provided, a source electrode 212a and the drain electrode 212b which are in contact with the oxide semiconductor layer 211 and provided apart from each other, a gate insulating film 213 provided over at least a channel formation region of the oxide semiconductor layer 211, and a gate electrode 214b which overlaps with the oxide semiconductor layer 211 and provided over the gate insulating film 213 (FIG. 6D). Note that although not illustrated, an electrode 214a is electrically connected to the gate electrode 214b, and the gate electrode 204 is electrically connected to the electrode 214a.

The interlayer insulating film 205 functions as a base insulating film of the oxide semiconductor layer 211.

It is preferable that the interlayer insulating film 205 contain oxygen at least in its surface and be formed using an insulating oxide in which part of the oxygen is desorbed by a heat treatment. As an insulating oxide in which part of oxygen is desorbed by a heat treatment, a material containing more oxygen than that in the stoichiometric proportion is preferably used. This is because oxygen can be supplied to an oxide semiconductor film in contact with the interlayer insulating film 205 by the heat treatment.

As an insulating oxide contains more oxygen than that in the stoichiometric proportion, SiOx (a silicon oxide) in which x is larger than 2 can be given, for example. However, one embodiment of the present invention is not limited thereto, and the interlayer insulating film 205 may be formed using a silicon oxide, a silicon oxynitride, a silicon nitride oxide, an aluminum oxynitride, a gallium oxide, a hafnium oxide, an yttrium oxide, or the like.

Note that the interlayer insulating film 205 may be a stack of a plurality of films. The interlayer insulating film 205 may have a stacked structure in which a silicon oxide film is formed over a silicon nitride film.

In an insulating oxide which contains more oxygen than that in the stoichiometric proportion, part of the oxygen is easily desorbed by a heat treatment. The desorption amount of oxygen (the value converted into that of oxygen atoms) obtained by TDS analysis when part of oxygen is easily desorbed by a heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, a method using the TDS analysis is described. The desorption amount of gas in the TDS analysis is proportional to a time integral value of ionic strength. Thus, from the ratio of the time integral value of the ionic strength of the oxide to a reference value of a standard sample, the desorption amount of gas can be calculated. The reference value of a standard sample refers to the ratio of the density of a predetermined atom contained in a sample (standard sample) to the integral value of a spectrum.

For example, from a time integral value of the ionic strength of a silicon wafer containing hydrogen at a predetermined density (a standard sample) and a time integral value of the ionic strength of an oxide, the desorption amount ($N_{O2}$) of oxygen molecules ($O_2$) of the oxide can be obtained by the following equation: $N_{O2} = N_{H2}/S_{H2} \times S_{O2} \times \alpha$.

$N_{H2}$ is a value obtained by conversion of the number of hydrogen molecules ($H_2$) desorbed from the standard sample into density. $S_{H2}$ is a time integral value of the ionic strength of hydrogen molecules ($H_2$) of the standard sample. In other words, the reference value of the standard sample is $N_{H2}/S_{H2}$. $S_{O2}$ is a time integral value of the ionic strength of oxygen molecules ($O_2$) of the insulating oxide. $\alpha$ is a coefficient affecting the ionic strength. Refer to Japanese Published Patent Application No. H6-275697 for details of the equation.

Note that the desorption amount of the oxygen obtained by TDS analysis (the value converted into that of oxygen atoms) is measured with use of a silicon wafer containing hydrogen atoms at $1 \times 10^{16}$ atoms/cm$^3$ as the standard sample, by using a thermal desorption spectrometer, EMD-WA1000S/W manufactured by ESCO, Ltd.

Note that in the TDS analysis, part of oxygen is detected as an oxygen atom. The ratio between oxygen molecules and oxygen atoms can be calculated from the ionization rate of the oxygen molecules. Note that, since the coefficient $\alpha$ includes the ionization rate of the oxygen molecules, the number of the released oxygen atoms can also be calculated through the evaluation of the number of the released oxygen molecules.

In addition, $N_{O2}$ is the number of desorbed oxygen molecules ($O_2$). Therefore, the desorption amount of oxygen converted into oxygen atoms is twice the number of desorbed oxygen molecules ($O_2$).

The interlayer insulating film 205 may be formed by a sputtering method, a CVD method, or the like, preferably formed by a sputtering method. In the case of forming a silicon oxide film as the interlayer insulating film 205, a quartz (preferably synthesized quartz) target may be used as a target and an argon gas may be used as a sputtering gas. Alternatively, a silicon target may be used as a target and a gas containing oxygen may be used as a sputtering gas. As a gas containing oxygen, a mixed gas of an argon gas and an oxygen gas may be used or only an oxygen gas may be used.

After the interlayer insulating film 205 is formed, a first heat treatment is performed before an oxide semiconductor film to be the oxide semiconductor layer 211 is formed. The first heat treatment is a step for removing water and hydrogen from the interlayer insulating film 205. A temperature of the first heat treatment is preferably higher than or equal to a temperature at which water and hydrogen are desorbed from the interlayer insulating film 205 (a temperature at which desorption amount is at a peak) and lower than a temperature at which the semiconductor substrate 200 in which the p-channel transistor and the n-channel transistor are provided is degraded or distorted. The temperature is preferably higher than or equal to 400° C. and lower than or equal to 750° C., and may be lower than a temperature of a second heat treatment performed in a later step.

Then, the second heat treatment is performed after the oxide semiconductor film is formed. The second heat treatment is a step for supplying oxygen to the oxide semiconductor film from the interlayer insulating film 205 which is an oxygen supply source. Note that the timing at which the second heat treatment is performed is not limited thereto, and the second heat treatment may be performed after the oxide semiconductor film is processed to form the oxide semiconductor layer 211.

Note that it is preferable that in the first heat treatment, hydrogen, water, a hydroxyl group, hydride, and the like be not contained in a nitrogen gas or a rare gas such as helium, neon, or argon. Alternatively, the purity of nitrogen or a rare gas such as helium, neon, or argon introduced into a heat treatment apparatus is preferably 6N (99.9999%) or higher, more preferably 7N (99.99999%) or higher (that is, the impurity concentration is 1 ppm or lower, preferably 0.1 ppm or lower).

In some cases, the oxide semiconductor film or the oxide semiconductor layer 211 might be crystallized to be a microcrystalline layer or a polycrystalline layer depending on the conditions of the second heat treatment or the material of the oxide semiconductor layer 211. For example, the oxide semiconductor film or the oxide semiconductor layer 211 may be crystallized into a microcrystalline oxide semiconductor layer having a degree of crystallization of greater than or equal to 90%, or greater than or equal to 80%. Further, depending on the conditions of the second heat treatment or the material of the oxide semiconductor film or the oxide semiconductor layer 211, the oxide semiconductor film or the oxide semiconductor layer 211 may be an amorphous oxide semiconductor layer including no crystalline component. Alternatively, there is a case where an amorphous layer contains mirocrystals (the crystal grain size is more than or equal to 1 nm and less than or equal to 20 nm).

Note that in the second heat treatment, the interlayer insulating film 205 is an oxygen supply source.

Note that the average surface roughness ($R_a$) of the interlayer insulating film 205 which is a formation surface of the oxide semiconductor film is preferably greater than or equal to 0.1 nm and less than 0.5 nm. That is because when the oxide semiconductor film has crystallinity, the crystal orientations thereof can be substantially aligned.

Here, the average surface roughness ($R_a$) is obtained by expanding into three dimensions center line average surface roughness $R_a$ which is defined by JIS B 0601:2001 (ISO 4287:1997) so as to be able to apply $R_a$ to a measurement surface. The average surface roughness ($R_a$) is an average value of the absolute values of deviations from the reference surface to the specific surface.

Here, the center line average roughness ($R_a$) is shown by the following formula (1) assuming that a portion having a measurement length L is picked up from a roughness curve in the direction of the center line of the roughness curve, the direction of the center line of the roughness curve of the picked portion is represented by an X-axis, the direction of longitudinal magnification (direction perpendicular to the X-axis) is represented by a Y-axis, and the roughness curve is expressed as Y=F(X).

[FORMULA 1]

$$R_a = \frac{1}{L}\int_0^L |F(X)|\, dX \qquad (1)$$

When the measurement surface which is a surface represented by measurement data are expressed as Z=F(X,Y), the average surface roughness ($R_a$) is an average value of the absolute values of deviations from the reference surface to the specific surface and is shown by the following formula (2).

[FORMULA 2]

$$R_a = \frac{1}{S_0}\int_{Y_1}^{Y_2}\int_{X_1}^{X_2} |F(X,Y) - Z_0|\, dX\, dY \qquad (2)$$

Here, the specific surface is a surface which is a target of roughness measurement, and is a rectangular region which is surrounded by four points represented by the coordinates $(X_1,Y_1)$, $(X_1,Y_2)$, $(X_2,Y_1)$, and $(X_2,Y_2)$. $S_0$ represents the area of the specific surface when the specific surface is flat ideally.

In addition, the reference surface refers to a surface parallel to an X-Y surface at the average height of the specific surface. In short, when the average value of the height of the specific surface is denoted by $Z_0$, the height of the reference surface is also denoted by $Z_0$.

A chemical mechanical polishing (CMP) treatment may be performed so that the average surface roughness of the interlayer insulating film 205 is greater than or equal to 0.1 nm and less than 0.5 nm in this manner. The CMP treatment may be performed any time as long as the timing is before the oxide semiconductor film is formed. Note that it is preferable that the CMP treatment be performed before the first heat treatment.

Here, the CMP treatment may be performed once or more. When the CMP process is performed in plural times, it is preferable that the first polishing step be performed at a high polishing rate and be followed by a final polishing step at a low polishing rate.

Alternatively, in order to planarize the interlayer insulating film 205, dry etching or the like may be performed instead of the CMP treatment. Here, as an etching gas, a chloride gas such as chlorine, boron chloride, silicon chloride, carbon tetrachloride, or the like; a fluoride gas such as carbon tetrafluoride, sulfur fluoride, nitrogen fluoride, or the like; or the like can be used.

Alternatively, in order to planarize the interlayer insulating film 205, a plasma treatment or the like may be performed instead of the CMP treatment. Here, a rare gas may be used for the plasma treatment. By the plasma treatment, the surface to be processed is irradiated with ions of an inert gas and minute unevenness of the surface is reduced by a sputtering effect. Such a plasma treatment is also referred to as the reverse sputtering.

Note that in order to planarize the interlayer insulating film 205, any of the above treatments may be performed. For example, only the reverse sputtering may be performed, or the dry etching may be performed after the CMP treatment. Note that in order to prevent water from entering the interlayer insulating film 205 which is the formation surface of the oxide semiconductor film, the dry etching or the reverse sputtering is preferably performed. In particular, when a planarizing treatment is performed after the first heat treatment, the dry etching or the reverse sputtering is preferably performed.

The oxide semiconductor layer 211 may be selectively formed in such a manner that an oxide semiconductor film is formed, an etching mask is formed over the oxide semiconductor film, and etching is performed. Alternatively, an ink-jet method may be used.

The oxide semiconductor film preferably contains indium (In) or zinc (Zn). In particular, both In and Zn are preferably contained. In addition, gallium (Ga) is preferably contained. When gallium (Ga) is contained, variation in the transistor characteristics can be reduced. Such an element capable of reducing variation in the transistor characteristics is referred to as a stabilizer. As a stabilizer, tin (Sn), hafnium (Hf), and aluminum (Al), can be given.

As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given. One or a plurality of these elements can be used.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as a Sn—Ga—Zn-based oxide, an Al—Ga—Zn-based oxide, a Sn—Al—Zn-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be given.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the oxide semiconductor film which can be used in one embodiment of the present invention is not limited to those described above, and an oxide semiconductor film including an appropriate composition may be used in accordance with needed semiconductor characteristics (the mobility, the threshold value, the variation, and the like). In accordance with needed transistor characteristics (semiconductor characteristics), the carrier concentration, the impurity concentration, the defect density, the atomic ratio of a metal element and oxygen, the interatomic distance, the density, and the like may be appropriately adjusted.

For example, relatively high mobility can be obtained with the use of an In—Sn—Zn-based oxide. However, the mobility can be increased by reducing the defect density in the bulk also in the case of using the In—Ga—Zn-based oxide.

The oxide semiconductor may be either single crystal or non-single-crystal. In the case where the oxide semiconductor is non-single-crystal, the oxide semiconductor may be either amorphous or polycrystalline. Further, the oxide semiconductor may have a structure including a crystalline portion in an amorphous portion. Alternatively, the oxide semiconductor may be non-amorphous.

Note that it is preferable that excess oxygen be contained in the metal oxide as compared to oxygen in the stoichiometric proportion. When excess oxygen is contained, generation of carriers due to oxygen deficiency in the oxide semiconductor film to be formed can be prevented.

Note that for example, in the case where the oxide semiconductor film is formed using an In—Zn-based metal oxide, a target has a composition ratio where In/Zn is 1 to 100, preferably 1 to 20, more preferably 1 to 10 in an atomic ratio. When the atomic ratio of In with respect to Zn is in the above preferred range, the field-effect mobility can be improved. Here, when the atomic ratio of the metal oxide is In:Zn:O=X:Y:Z, it is preferable to satisfy the relation of $Z>1.5X+Y$ so that excess oxygen is contained.

Here, the filling factor of the oxide target is greater than or equal to 90% and less than or equal to 100%, preferably greater than or equal to 95% and less than or equal to 99.9%. High filling factor of the target enables the oxide semiconductor film to be formed to be dense.

Note that the energy gap of a metal oxide which can be applied to the oxide semiconductor film is preferably 2 eV or more, more preferably 2.5 eV or more, still more preferably 3 eV or more. In this manner, the off-state current of a transistor can be reduced by using a metal oxide having a wide band gap.

Note that the oxide semiconductor film contains hydrogen. Note that the hydrogen may be contained in the oxide semiconductor film in the form of a hydrogen molecule, water, a hydroxyl group, or hydride in some cases, in addition to a hydrogen atom. It is preferable that hydrogen contained in the oxide semiconductor film be as little as possible.

Note that the concentrations of an alkali metal and an alkaline earth metal in the oxide semiconductor film are preferably low, and these concentrations are preferably lower than or equal to $1\times10^{18}$ atoms/cm$^3$, more preferably lower than or equal to $2\times10^{16}$ atoms/cm$^3$. When an alkali metal and an alkaline earth metal are bonded to an oxide semiconductor, a carrier may be generated, which causes increase in the off-state current of the transistor.

Note that there is no particular limitation on the formation method and the thickness of the oxide semiconductor film, and they can be determined in consideration of the size or the like of a transistor to be manufactured. As an example of a method for forming the oxide semiconductor film, a sputtering method, a molecular beam epitaxy method, a coating method, a printing method, a pulsed laser deposition method, or the like can be given. The thickness of the oxide semiconductor film is preferably greater than or equal to 3 nm and less than or equal to 50 nm. This is because when the thickness is greater than or equal to 50 nm, the transistor might be normally on. When the thickness of the oxide semiconductor film is less than or equal to 5 nm in the case where the channel length of the transistor is 30 μm, short channel effect can be prevented.

Here, as a preferable example, the oxide semiconductor film is formed by a sputtering method using an In—Ga—Zn-based metal oxide target. A rare gas (e.g., an argon gas), an oxygen gas, or a mixed gas of a rare gas and an oxygen gas may be used as a sputtering gas.

It is preferable that a high-purity gas from which hydrogen, water, a hydroxyl group, or hydride is removed be used as the sputtering gas for the formation of the oxide semiconductor film. In order to highly purify the sputtering gas, a gas attached to the inside wall of a treatment chamber or the like is removed and a heat treatment is performed on the semiconductor substrate 200, in which the p-channel transistor and the n-channel transistor are provided, before the oxide semiconductor film is formed. Further, a sputtering gas introduced into the treatment chamber may be a high-purity gas. In that case, when an argon gas is used, it is preferable that the purity be 9N (99.9999999%) or more, the dew point be −121° C. or lower, the content of water be 0.1 ppb or lower, and the content of hydrogen be 0.5 ppb or lower. When an oxygen gas is used, it is preferable that the purity be 8N (99.999999%) or more, the dew point be −112° C. or lower, the content of water be 1 ppb or lower, and the content of hydrogen be 1 ppb or lower. The oxide semiconductor film is formed while the semiconductor substrate 200 in which the p-channel transistor and the n-channel transistor are provided is heated and kept at high temperature, so that the concentration of impurities, such as water, contained in the oxide semiconductor film can be reduced. Moreover, damage in the oxide semiconductor film caused by a sputtering method can be reduced. Here, the temperature of the semiconductor substrate 200 in which the p-channel transistor and the n-channel transistor are provided may be higher than or equal to 100° C. and lower than or equal to 600° C., preferably, higher than or equal to 200° C. and lower than or equal to 400° C.

Further, excess oxygen can be supplied to the oxide semiconductor film by ion implantation.

Note that the oxide semiconductor film may have an amorphous structure or a crystalline structure. As a preferable embodiment of the case where the oxide semiconductor film has crystalline structures, a c-axis aligned crystalline (CAAC) oxide semiconductor film can be given. When the oxide semiconductor film is a CAAC oxide semiconductor film, the reliability of the transistor can be increased.

Note that a CAAC oxide semiconductor film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis).

In a broad sense, a CAAC oxide semiconductor film means a non-single-crystal oxide including a phase which has a triangular, hexagonal, regular triangular, or regular hexagonal atomic when seen from the direction perpendicular to the a-b plane and in which metal atoms are arranged in a layered manner or metal atoms and oxygen atoms are arranged in a layered manner when seen from the direction perpendicular to the c-axis.

The CAAC oxide semiconductor film is not a single crystal, but this does not mean that the CAAC oxide semiconductor film is composed of only an amorphous component. Although the CAAC oxide semiconductor film includes a crystallized portion (crystalline portion), a boundary between one crystalline portion and another crystalline portion is not necessarily clear.

Nitrogen may be substituted for part of oxygen included in the CAAC oxide semiconductor film. The c-axes of crystal portions of individual CAAC oxide semiconductor film may be aligned in one direction (e.g., a direction perpendicular to a surface of a substrate over which the CAAC oxide semiconductor film is formed, a surface, or an interface of the CAAC oxide semiconductor film). Alternatively, normals of the a-b planes of individual crystalline portions included in the CAAC oxide semiconductor film may be aligned in one direction (e.g., a direction perpendicular to the surface of the substrate over which the CAAC oxide semiconductor film is formed, the surface, or the interface of the CAAC oxide semiconductor film).

Note that the CAAC oxide semiconductor film may be a conductor, a semiconductor, or an insulator depending on its composition or the like. Further, the CAAC oxide semiconductor film may transmit or not transmit visible light depending on its composition or the like.

As an example of such a CAAC oxide semiconductor film, there is a material which is formed into a film shape and has a triangular or hexagonal atomic arrangement when observed from the direction perpendicular to a surface of the film, a surface of a substrate, or an interface and in which metal atoms are arranged in a layered manner or metal atoms and oxygen atoms (or nitrogen atoms) are arranged in a layered manner when a cross section of the film is observed.

An example of the CAAC oxide semiconductor film is described in detail with reference to FIGS. 7A to 7E, FIGS. 8A to 8C, and FIGS. 9A to 9C. In FIGS. 7A to 7E, FIGS. 8A to 8C, and FIGS. 9A to 9C, the vertical direction corresponds to the c-axis direction and a plane perpendicular to the c-axis direction corresponds to the a-b plane, in principle. When the expressions "an upper half" and "a lower half" are simply used, they refer to an upper half and a lower half with respect to the a-b plane. Furthermore, in FIGS. 7A to 7E, O surrounded by a circle represents tetracoordinate O and O surrounded by a double circle represents tricoordinate O.

Figure 7A:
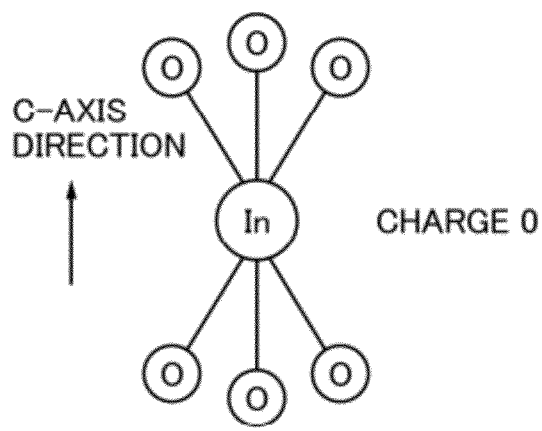
FIGS. 7A to 7E each illustrate a structure of an oxide semiconductor which can be applied to a transistor.

FIG. 7A illustrates a structure including one hexacoordinate indium (hereinafter referred to as In) atom and six tetracoordinate oxygen (hereinafter referred to as tetracoordinate O) atoms proximate to the In atom. Here, a structure including one In atom and oxygen atoms proximate thereto is referred to as a subunit. The structure in FIG. 7A is actually an octahedral structure, but is illustrated as a planar structure for simplicity. Note that three tetracoordinate O atoms exist in each of an upper half and a lower half in FIG. 7A. In the subunit illustrated in FIG. 7A, electric charge is 0.

Figure 7D:
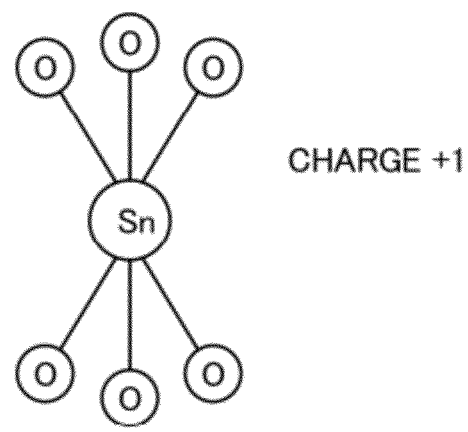
Figure 7B:
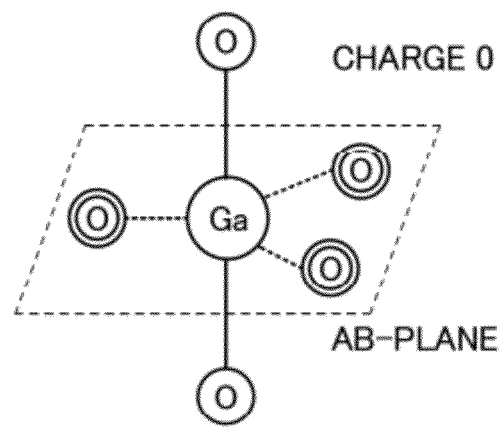

FIG. 7B illustrates a structure including one pentacoordinate gallium (hereinafter referred to as Ga) atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 7B. An In atom can also have the structure illustrated in FIG. 7B because an In atom can have five ligands. In the subunit illustrated in FIG. 7B, electric charge is 0.

Figure 7E:
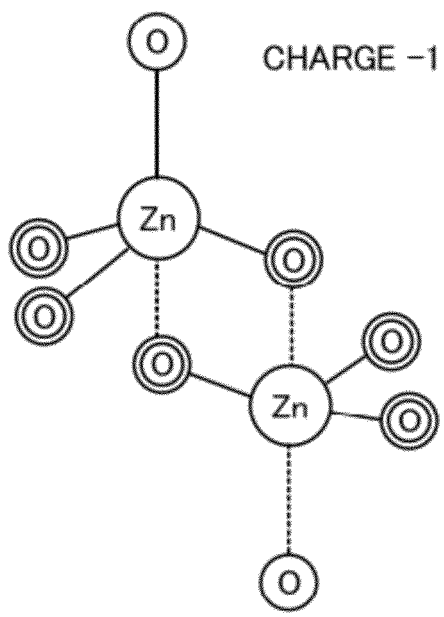
Figure 7C:
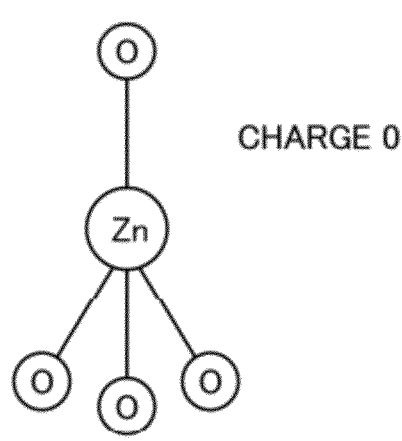

FIG. 7C illustrates a structure including one tetracoordinate zinc (hereinafter referred to as Zn) atom and four tetracoordinate O atoms proximate to the Zn atom. In FIG. 7C, one tetracoordinate O atom exists in an upper half and three tetracoordinate O atoms exist in a lower half. In the subunit illustrated in FIG. 7C, electric charge is 0.

FIG. 7D illustrates a structure including one hexacoordinate tin (hereinafter referred to as Sn) atom and six tetracoordinate O atoms proximate to the Sn atom. In FIG. 7D, three tetracoordinate O atoms exist in each of an upper half and a lower half. In the subunit illustrated in FIG. 7D, electric charge is +1.

FIG. 7E illustrates a subunit including two Zn atoms. In FIG. 7E, one tetracoordinate O atom exists in each of an upper half and a lower half. In the subunit illustrated in FIG. 7E, electric charge is −1.

Here, a plurality of subunits form one group, and a plurality of groups form a unit which is one cycle.

Now, a rule of bonding between the subunits is described. The three O atoms in the upper half with respect to the hexacoordinate In atom in FIG. 7A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. The reason is described below. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, one group can be formed in a different manner by combining subunits so that the total electric charge of the layered structure is 0.

Figure 8A:
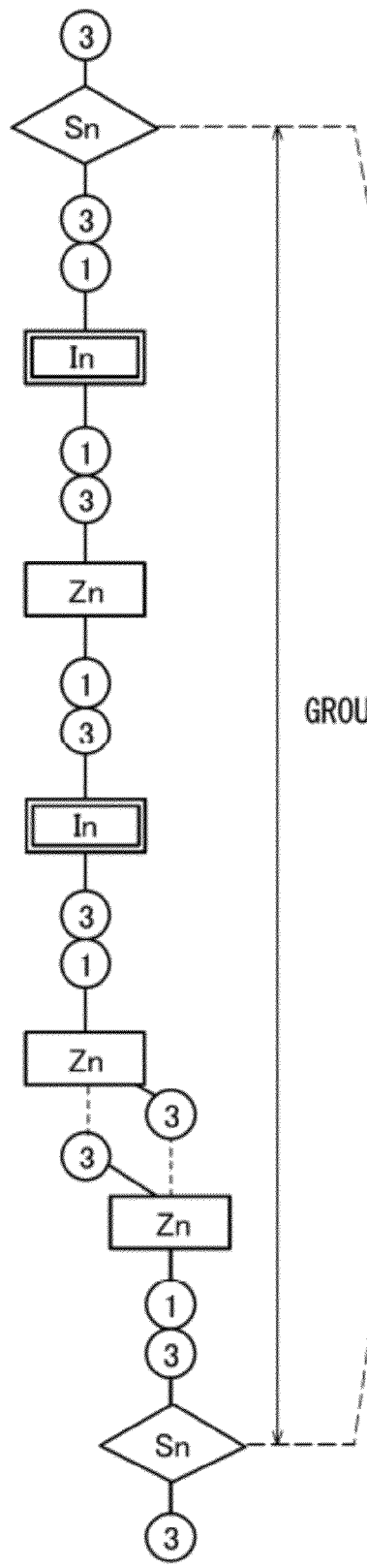
FIGS. 8A to 8C illustrate a structure of an oxide semiconductor which can be applied to a transistor.
Figure 8B:
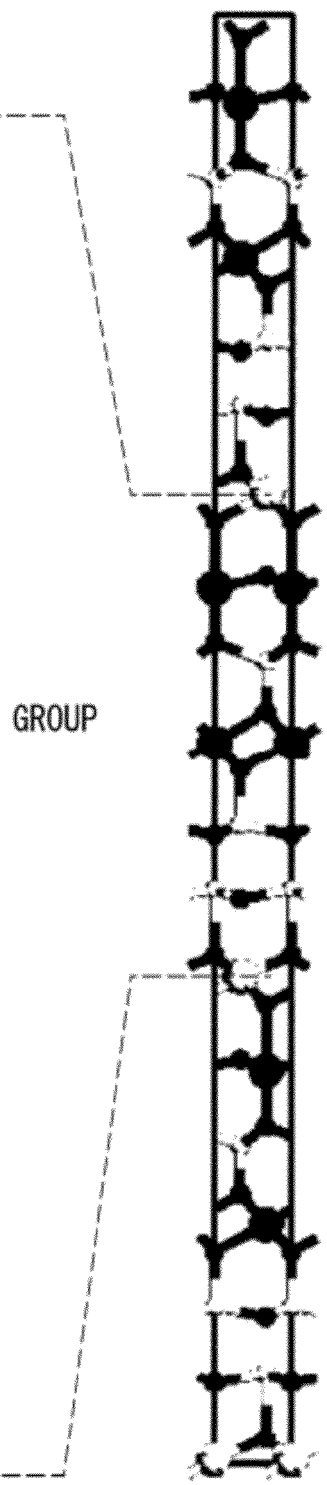
Figure 8C:
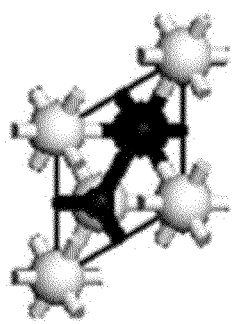

FIG. 8A illustrates a model of one group included in a layered structure of an In—Sn—Zn-based material. FIG. 8B illustrates a unit including three groups. Note that FIG. 8C illustrates an atomic arrangement in the case where the layered structure in FIG. 8B is observed from the c-axis direction.

In FIG. 8A, a tricoordinate O atom is omitted for simplicity, and a tetracoordinate O atoms are illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 8A, one tetracoordinate O atom existing in each of an upper half and a lower half with respect to an In atom is denoted by circled 1. FIG. 8A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn-based material in FIG. 8A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups are bonded, so that a unit which is one cycle is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a subunit including a Sn atom is +1. Therefore, electric charge of −1, which cancels +1, is needed to form a layered structure including a Sn atom. As a structure having electric charge of −1, the subunit including two Zn atoms as illustrated in FIG. 7E can be given. For example, with one subunit including two Zn atoms, electric charge of one subunit including a Sn atom can be cancelled, so that the total electric charge of the layered structure can be 0.

An In atom can have either five ligands or six ligands. When the unit illustrated in FIG. 8B is used, an In—Sn—Zn-based crystal ($In_2SnZn_3O_8$) can be obtained. Note that a layered structure of the obtained In—Sn—Zn-based crystal can be expressed as a composition formula, $In_2SnZn_2O_7(ZnO)_m$ (m is 0 or a natural number). It is preferable that m be large because as m increases, the crystallinity of the In—Sn—Zn-based crystal is increased.

The same is applied to the case where a metal oxide other than the In—Sn—Zn-based metal oxide is used. As an example, FIG. 9A illustrates a model of one group included in a layered structure of an In—Ga—Zn-based crystal.

Figure 9A:
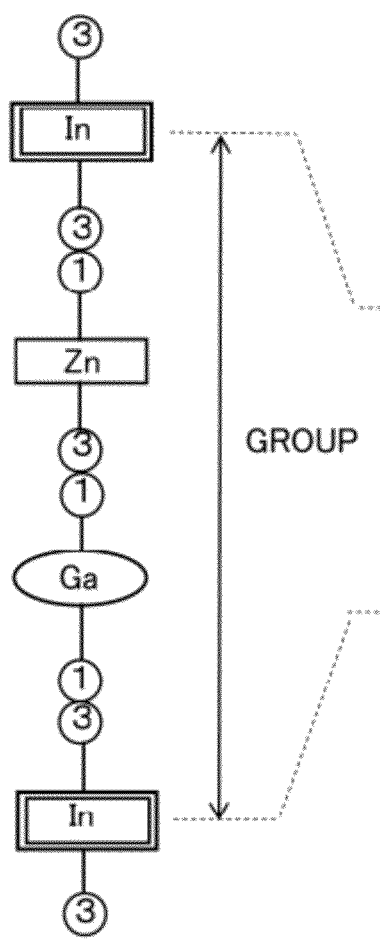
FIGS. 9A to 9C illustrate a structure of an oxide semiconductor which can be applied to a transistor.

In the group included in the layered structure of the In—Ga—Zn-based material in FIG. 9A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups are bonded, so that a unit which is one cycle is formed.

Figure 9B:
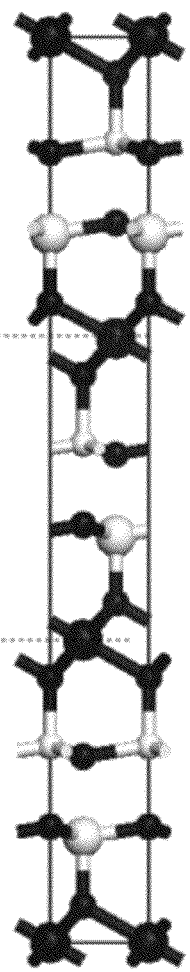
Figure 9C:
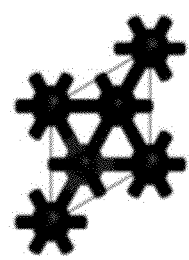

FIG. 9B illustrates a unit including three groups. Note that FIG. 9C illustrates an atomic arrangement in the case where the layered structure in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a subunit including any of an In atom, a Zn atom, and a Ga atom is 0. As a result, the total electric charge of one group having a combination of such subunits is always 0.

A group forming the layered structure of the In—Ga—Zn-based crystal is not limited to the group illustrated in FIG. 9A.

Here, a method for forming the CAAC oxide semiconductor film is described.

First, an oxide semiconductor film is formed by a sputtering method or the like. Note that the oxide semiconductor film is formed while the semiconductor substrate 200 in which the p-channel transistor and the n-channel transistor are provided is kept at high temperature, so that the ratio of a crystalline portion to an amorphous portion can be high. At that time, the temperature of the semiconductor substrate 200 in which the p-channel transistor and the n-channel transistor are provided may be, for example, higher than or equal to 150° C. and lower than or equal to 450° C., preferably, higher than or equal to 200° C. and lower than or equal to 350° C.

Here, the formed oxide semiconductor film may be subjected to a heat treatment. By the heat treatment, the ratio of a crystalline portion to an amorphous portion can be high. The temperature of the semiconductor substrate 200, in which the p-channel transistor and the n-channel transistor are provided, at the heat treatment may be higher than or equal to 200° C. and lower than a temperature at which the semiconductor substrate 200 in which the p-channel transistor and the n-channel transistor are provided is degraded or distorted, preferably, higher than or equal to 250° C. and lower than or equal to 450° C. The time for the heat treatment may be longer than or equal to 3 minutes, and preferably shorter than or equal to 24 hours. This is because a long heat treatment decreases the productivity although it increases the ratio of a crystalline portion to an amorphous portion. Note that the heat treatment may be performed in an oxidation atmosphere or an inert atmosphere; however, there is no limitation thereon. This heat treatment may be performed under a reduced pressure.

The oxidizing atmosphere is an atmosphere containing an oxidizing gas. As an example of the oxidizing gas, oxygen, ozone, and nitrous oxide can be given. It is preferable that components (e.g., water and hydrogen) which are not preferably contained in the oxide semiconductor film be removed from the oxidation atmosphere as much as possible. For example, the purity of oxygen, ozone, or nitrous oxide is greater than or equal to 8N (99.999999%), preferably greater than or equal to 9N (99.9999999%).

The oxidation atmosphere may contain an inert gas such as a rare gas. Note that the oxidation atmosphere contains an oxidizing gas at a concentration of greater than or equal to 10 ppm. Note that an inert atmosphere contains an inert gas (a nitrogen gas, a rare gas, or the like) and contains a reactive gas such as an oxidizing gas at a concentration of less than 10 ppm.

Note that a rapid thermal anneal (RTA) apparatus may be used for all of the heat treatments. With the use of the RTA apparatus, only in a short time, the heat treatments can be performed at high temperature. Thus, the oxide semiconductor film having a high ratio of a crystalline portion to an amorphous portion can be formed and decrease in productivity can be suppressed.

However, the apparatus used for all of the heat treatments is not limited to an RTA apparatus; for example, an apparatus provided with a unit that heats an object to be processed by thermal conduction or thermal radiation from a resistance heater or the like may be used. For example, an electric furnace or a rapid thermal anneal (RTA) apparatus such as a gas rapid thermal anneal (GRTA) apparatus or a lamp rapid thermal anneal (LRTA) apparatus can be given as the heat treatment apparatus used for all of the heat treatments. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heat medium. Here, the temperature of the high-temperature gas is preferably higher than the heat temperature of the object to be processed.

With use of an In—Ga—Zn-based metal oxide in which the nitrogen concentration is higher than or equal to $1\times10^{17}$ atoms/cm$^3$ and lower than or equal to $5\times10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

Further, to form an In—Sn—Zn-based metal oxide, a target having an atomic ratio of In:Sn:Zn=1:2:2, 2:1:3, 1:1:1, or 20:45:35 may be used.

As described above, the CAAC oxide semiconductor film can be formed.

The CAAC oxide semiconductor film has high orderliness of a bond between metal and oxygen as compared to an oxide semiconductor film having an amorphous structure. In other words, in the case of an oxide semiconductor film having an amorphous structure, the number of oxygen atoms coordinated around a metal atom may vary according to the kind of an adjacent metal. In contrast, in the case of the CAAC oxide semiconductor film, the number of oxygen atoms coordinated around a metal atom is substantially the same. Therefore, oxygen deficiency is hardly observed even at a microscopic level, and charge transfer and instability of electric conductivity due to hydrogen atoms (including hydrogen ions), alkali metal atoms, or the like can be prevented.

Therefore, a transistor is formed using a CAAC oxide semiconductor film for its channel formation region, whereby the threshold voltage of the transistor can be prevented from changing after light irradiation or a bias-temperature stress (BT) test performed on the transistor, and the transistor can have stable electrical characteristics.

Next, an etching mask is formed over the oxide semiconductor film and etching is performed, whereby the oxide semiconductor layer 211 is formed (FIG. 6A).

In addition, the source electrode 212a and the drain electrode 212b are formed to be in contact with the oxide semiconductor layer 211 and to be apart from each other (FIG. 6B).

The source electrode 212a and the drain electrode 212b may be selectively formed in such a manner that, for example, a conductive film (e.g., a metal film or a silicon film to which an impurity element imparting one conductivity type is added) is formed by a sputtering method, an etching mask is formed over the conductive film, and etching is performed. Alternatively, an ink-jet method may be used. Note that the conductive film to be the source electrode 212a and the drain electrode 212b may be formed to have either a single-layer structure or a structure in which a plurality of layers are stacked. For example, the conductive film may be formed to have a three-layer structure in which an Al layer is sandwiched between Ti layers. Note that a layer serving as the source electrode 212a and the drain electrode 212b also functions as signal lines.

Next, the gate insulating film 213 is formed over at least the channel formation region of the oxide semiconductor layer 211, and after that an opening is formed (FIG. 6C). The opening is formed to overlap with the gate electrode 204.

The gate insulating film 213 may be formed using an insulating material (e.g., a silicon nitride, a silicon nitride oxide, a silicon oxynitride, or a silicon oxide) by a sputtering method, for example. Note that the gate insulating film 213 may have a single-layer structure or a stacked structure including a plurality of layers. A stacked structure of two layers in which a silicon oxynitride layer is stacked over a silicon nitride layer is employed here, for example. Note that in the case where the gate insulating film 213 is formed by a sputtering method, hydrogen and moisture can be prevented from entering the oxide semiconductor layer 211. The gate insulating film 213 is preferably an insulating oxide film because oxygen vacancies can be filled by supply of oxygen.

Note that, a "silicon nitride oxide" contains more nitrogen than oxygen. Note that a "silicon oxynitride" contains more oxygen than nitrogen.

Here, the oxide semiconductor film may be processed by dry etching. For example, a chlorine gas or a mixed gas of a boron trichloride gas and a chlorine gas may be used as an etching gas used for the dry etching. However, there is no limitation thereon; wet etching may be used or another method capable of processing the oxide semiconductor film may be used.

The gate insulating film 213 contains oxygen at least in a portion in contact with the oxide semiconductor layer 211 and is preferably formed using an insulating oxide in which part of the oxygen is desorbed by heating. In other words, the materials given as the material of the interlayer insulating film 205 are preferably used. When the portion of the gate insulating film 213 which is in contact with the oxide semiconductor layer 211 is formed using a silicon oxide, oxygen can be diffused into the oxide semiconductor layer 211 and reduction in the resistance of the transistor can be prevented.

Note that the gate insulating film 213 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), a hafnium oxide, an yttrium oxide, or a lanthanum oxide, whereby gate leakage current can be reduced. Here, gate leakage current refers to leakage current which flows between a gate electrode and a source or drain electrode. Further, a layer formed using the high-k material and a layer formed using a silicon oxide, a silicon oxynitride, a silicon nitride, a silicon nitride oxide, an aluminum oxide, an aluminum oxynitride, or a gallium oxide may be stacked. Note that even in the case where the gate insulating film 213 has a stacked structure, the portion in contact with the oxide semiconductor layer 211 is preferably formed using an insulating oxide.

The gate insulating film 213 may be formed by a sputtering method. The thickness of the gate insulating film 213 is greater than or equal to 1 nm and less than or equal to 300 nm, preferably greater than or equal to 5 nm and less than or equal to 50 nm. When the thickness of the gate insulating film 213 is greater than or equal to 5 nm, gate leakage current can be particularly reduced.

In addition, a third heat treatment (preferably at a temperature higher than or equal to 200° C. and lower than or equal to 400° C., for example, at a temperature higher than or equal to 250° C. and lower than or equal to 350° C.) may be performed in an inert gas atmosphere or an oxygen gas atmosphere. The third heat treatment allows hydrogen or moisture remaining in the oxide semiconductor layer 211 to be diffused into the gate insulating film. Further, the third heat treatment allows the oxide semiconductor layer 211 to be supplied with oxygen from the gate insulating film 213 as a supply source.

The third heat treatment is performed after the gate insulating film 213 is formed over the oxide semiconductor layer 211 here, but the timing is not limited thereto. The third heat treatment may be performed after a conductive film to be the electrode 214a and the gate electrode 214b or the electrode 214a and the gate electrode 214b is formed.

Note that the hydrogen concentration of the oxide semiconductor layer 211 is $5.0 \times 10^{19}$ atoms/cm$^3$ or lower, preferably $5.0 \times 10^{18}$ atoms/cm$^3$ or lower. The hydrogen concentration is reduced in this manner, whereby the threshold voltage of the transistor can be prevented from shifting in the negative direction.

Note that the carrier concentration of the oxide semiconductor layer 211 is preferably lower than $1.0 \times 10^{14}$/cm$^3$. The carrier concentration is reduced, whereby an off-state current can be kept low.

Next, a conductive film is formed over the gate insulating film 213 and an etching mask is formed thereover to perform etching, whereby the electrode 214a and the gate electrode 214b are formed (FIG. 6D). Note that a layer serving as the gate electrode 214b also functions at least as a scan line.

The electrode 214a and the gate electrode 214b may be formed using the same materials and methods as those of the source electrode 212a and the drain electrode 212b.

Note that although not illustrated, it is preferable that dopant be added to the oxide semiconductor layer 211 using the gate electrode 214b as a mask to form a source region and a drain region in the oxide semiconductor layer 211.

Here, the dopant may be added by an ion implantation method or an ion doping method. Alternatively, the dopant may be added by performing a plasma treatment in an atmosphere of a gas containing the dopant. As the added dopant, nitrogen, phosphorus, boron, or the like may be used.

As described above, a wide band gap semiconductor transistor illustrated in FIG. 5 can be formed over the transistor formed using a semiconductor substrate.

Here, as illustrated in FIG. 2, the CONa signal is input to a wiring provided in parallel with the word line W1a. The wiring to which the CONa signal is input is provided as illustrated in FIGS. 10A and 10B.

Figure 10A:
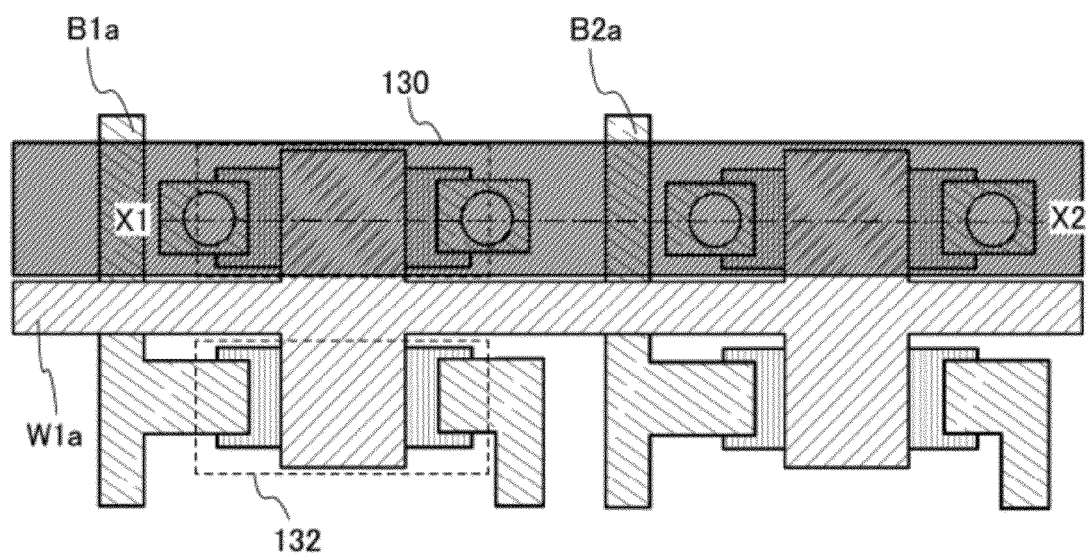
FIG. 10A is one preferable mode of top views of the wide band gap semiconductor transistor 130 and a transistor 132.
Figure 10B:
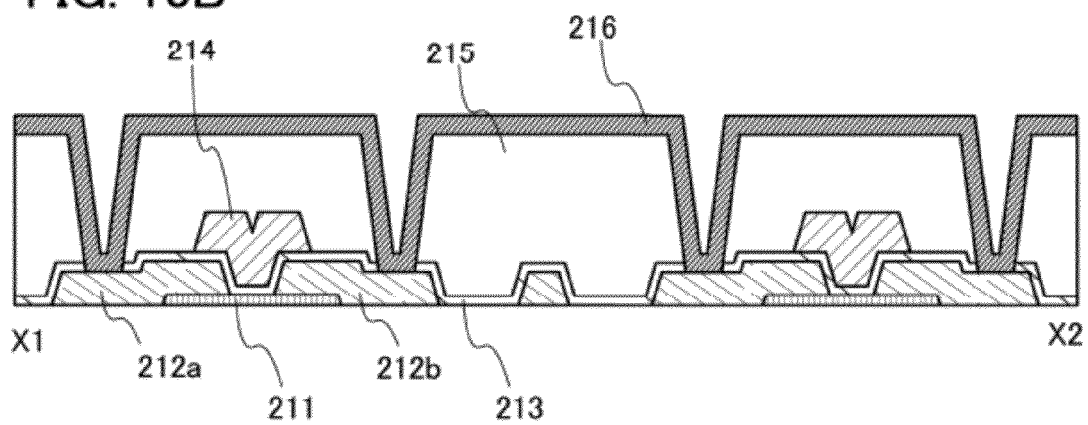
FIG. 10B is one preferable mode of cross-sectional views of the wide band gap semiconductor transistor 130 and a transistor 132.

FIG. 10A illustrates preferable top views of the wide band gap semiconductor transistors 130 and the transistors 132 of the storage element 102a (1, 1) and the storage element 102a (1, 2). FIG. 10B illustrates a preferable cross-sectional view taken along line X1-X2 in FIG. 10A.

An insulating layer 215 is provided over the wide band gap semiconductor transistor 130 and the transistor 132. A wiring layer 216 is provided over the insulating layer 215. The source and the drain of the wide band gap semiconductor transistor 130 are electrically connected to the wiring layer 216 through an opening provided in the insulating layer 215.

The gate of the wide band gap semiconductor transistor 130 and the gate of the transistor 132 are electrically connected to the word line W1a. One of the source and the drain of the transistor 132 is electrically connected to the bit line B1a or the bit line B2a.

As illustrated in FIGS. 10A and 10B, the source and the drain of the wide band gap semiconductor transistors 130 are preferably connected to not only each other but also a drain and a source of adjacent wide band gap semiconductor transistors with the wiring layer 216 along the word line W1a. Even when the characteristics of the wide band gap semiconductor transistors 130 which are provided in the storage elements 102a are varied, at least along the word line W1a, variation in characteristics of the wide band gap semiconductor transistors 130 can be prevented from affecting the operation of the storage elements 102a.

Note that the insulating layer 215 may be formed of any of insulating materials and the wiring layer 216 may be formed of any of conductive materials. The insulating layer 215 is preferably formed of a material with low permittivity (e.g., a silicon oxide), more preferably, a material with lower permittivity than a silicon oxide. By forming the insulating layer 215 of a material with low permittivity, parasitic capacitances between the bit line B1a and the word line W1a and between the bit line B1a and a wiring formed of the wiring layer 216 can be reduced.

Note that a wiring to which the PRE signal is input and a wiring to which the SAE signal is input are overlapped with the bit line with an insulating film is provided therebetween; therefore, parasitic capacitance between these wirings and the bit line is preferably reduced by forming these wirings of the wiring layer 216. Note that the PRE signal and the SAE signal are not as much affected by noise as the signal of the word line, and therefore, the structure is not limited thereto.

Note that, in the wide band gap semiconductor transistor manufactured in the above manner, the off-state current per micrometer in channel width at room temperature can be less than or equal to 10 aA/μm ($1 \times 10^{-17}$ A/μm), less than or equal to 1 aA/μm ($1 \times 10^{-18}$ A/μm), further less than or equal to 1 zA/μm ($1 \times 10^{-21}$ A/μm), still further less than or equal to 1 yA/μm ($1 \times 10^{-24}$ A/μm).

As described above, an oxide semiconductor is preferably used for a wide band gap semiconductor transistor. A transistor including an oxide semiconductor in a channel formation region can also have high field effect mobility.

Note that the field effect mobility of an OS transistor is practically lower than its original mobility. A factor of reduction in mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as Formula (3).

[FORMULA 3]

$$\mu = \mu_0 \exp\left(-\frac{E}{kT}\right) \quad (3)$$

Here, E represents the height of the potential barrier, k represents the Boltzmann constant, and T represents the absolute temperature. When the potential barrier is assumed to be attributed to a defect, the height of the potential barrier can be expressed as Formula (4) according to the Levinson model.

[FORMULA 4]

$$E = \frac{e^2 N^2}{8\varepsilon n} = \frac{e^3 N_t^2}{8\varepsilon C_{ox} V_g} \quad (4)$$

Here, e represents the elementary charge, N represents the average defect density per unit area in a channel, e represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region can be expressed as Formula (5).

[FORMULA 5]

$$I_d = \frac{W\mu V_g V_d C_{ox}}{L} \exp\left(-\frac{E}{kT}\right) \quad (5)$$

Here, L represents the channel length and W represents the channel width, and L and W are each 10 μm. In addition, $V_d$ represents the drain voltage. When dividing both sides of the above equation by $V_g$ and then taking logarithms of both sides, Formula (6) below can be obtained.

[FORMULA 6]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\,\varepsilon\,C_{ox}V_g} \quad (6)$$

The right side of Formula (6) is a function of $V_g$. From Formula (6), it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/cm^2$.

On the basis of the defect density obtained in this manner, or the like, $\mu_0$ can be calculated to be 120 cm$^2$/Vs from Formula (3) and Formula (4). The measured mobility of an In—Sn—Zn oxide including a defect is approximately 40 cm$^2$/Vs. However, the obtained result shows that when no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed as Formula (7).

[FORMULA 7]

$$\frac{1}{\mu_1} = \frac{1}{\mu_0} + \frac{D}{B}\exp\left(-\frac{x}{l}\right) \quad (7)$$

Here, D represents the electric field in the gate direction, and B and l are constants. B and l can be obtained from actual measurement results; according to the above measurement results, B is $4.75\times10^7$ cm/s and l is 10 nm (the depth to which the influence of interface scattering reaches). When D is increased (i.e., when the gate voltage is increased), the second term of Formula 7 is increased and accordingly the mobility $\mu_1$ is decreased.

Figure 11:
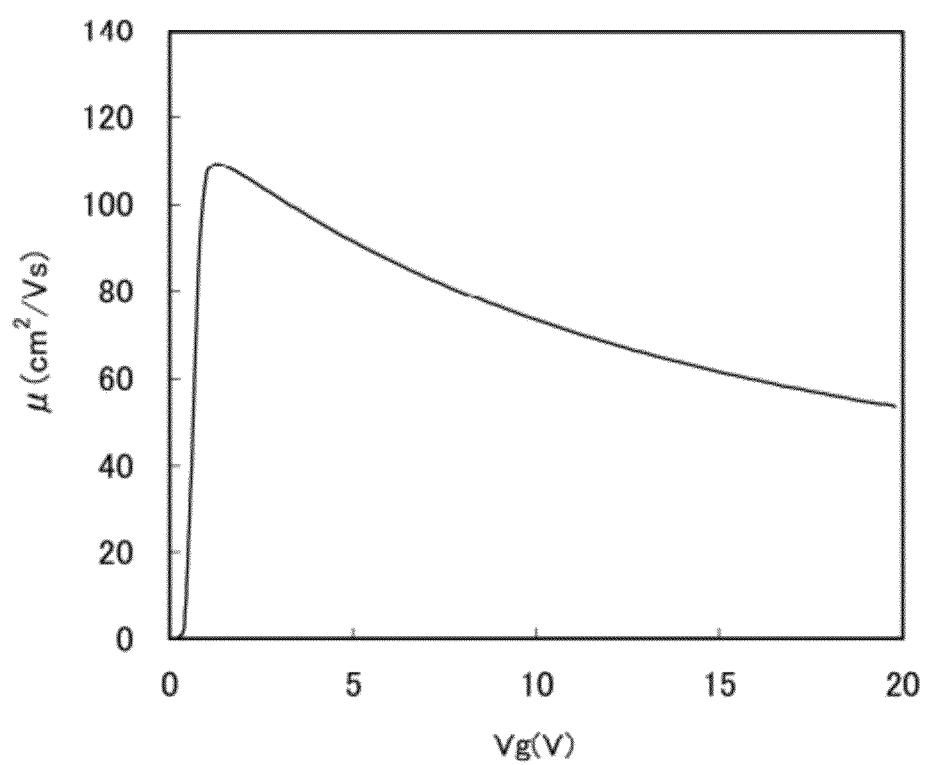
FIG. 11 shows the gate voltage dependence of mobility obtained by calculation.

Calculation results of the mobility $\mu_2$ of a transistor whose channel includes an ideal oxide semiconductor without a defect inside the semiconductor are shown in FIG. 11. For the calculation, device simulation software Sentaurus Device (manufactured by Synopsys, Inc.) was used, and the bandgap, the electron affinity, the relative permittivity, and the thickness of the oxide semiconductor film were assumed to be 2.8 eV, 4.7 eV, 15, and 15 nm, respectively. Further, the work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 11, the mobility has a peak of more than 100 cm$^2$/Vs at a gate voltage that is a little over 1 V and is decreased as the gate voltage becomes higher because the influence of interface scattering is increased. Note that in order to reduce interface scattering, as described with reference to Formula (1), it is preferable that a surface of the semiconductor layer be flat at the atomic level (atomic layer flatness).

Calculation results of characteristics of minute transistors which are manufactured using an oxide semiconductor having such a mobility are shown in FIGS. 12A to 12C, FIGS. 13A to 13C, and FIGS. 14A to 14C. Here, FIGS. 15A and 15B illustrate cross-sectional structures of the transistors used for the calculation. The transistors illustrated in FIGS. 15A and 15B each include a semiconductor region 303a and a semiconductor region 303c which have n$^+$-type conductivity in an oxide semiconductor layer. In the calculation, the resistivities of the semiconductor region 303a and the semiconductor region 303c are $2\times10^{-3}$ Ωcm.

The transistor illustrated in FIG. 15A includes a base insulator 301, an embedded insulator 302 which is formed of an aluminum oxide and is embedded in the base insulator 301, a semiconductor region 303a, a semiconductor region 303c, a semiconductor region 303b, and a gate 305. The semiconductor region 303b is sandwiched between the semiconductor regions 303a and 303c, functions as a channel formation region, and is intrinsic. In the calculation, the gate 305 has a width of 33 nm.

A gate insulator 304 is formed between the gate 305 and the semiconductor region 303b. In addition, a sidewall insulator 306a and a sidewall insulator 306b are formed on both side surfaces of the gate 305, and an insulator 307 is formed over the gate 305 so as to prevent a short circuit between the gate 305 and another wiring. The sidewall insulator has a width of 5 nm. A source 308a and a drain 308b are provided in contact with the semiconductor region 303a and the semiconductor region 303c, respectively. Note that the channel width of this transistor is 40 nm.

The transistor illustrated in FIG. 15B includes the base insulator 301, the embedded insulator 302 formed of an aluminum oxide, the semiconductor region 303a, the semiconductor region 303c, the semiconductor region 303b, the gate insulator 304, the gate 305, the sidewall insulator 306a, the sidewall insulator 306b, the insulator 307, a source 308a, and a drain 308b. The semiconductor region 303b is sandwiched between the semiconductor regions 303a and 303c, functions as a channel formation region, and is intrinsic.

The transistor illustrated in FIG. 15A is different from the transistor illustrated in FIG. 15B in the conductivity type of semiconductor regions provided directly below the sidewall insulator 306a and the sidewall insulator 306b. The sidewall insulator 306a and the semiconductor region directly below the sidewall insulator 306b are regions having n$^+$ conductivity type in the transistor illustrated in FIG. 15A but are intrinsic semiconductor regions in the transistor illustrated in FIG. 15B. In other words, the transistor illustrated in FIG. 15B has a region having a width of $L_{off}$ which overlaps with neither the semiconductor region 303a (the semiconductor region 303c) nor the gate 305. This region is called an offset region, and the width $L_{off}$ is called an offset length. The offset length is equal to the width of the sidewall insulator 306a (the sidewall insulator 306b).

Figure 12A:
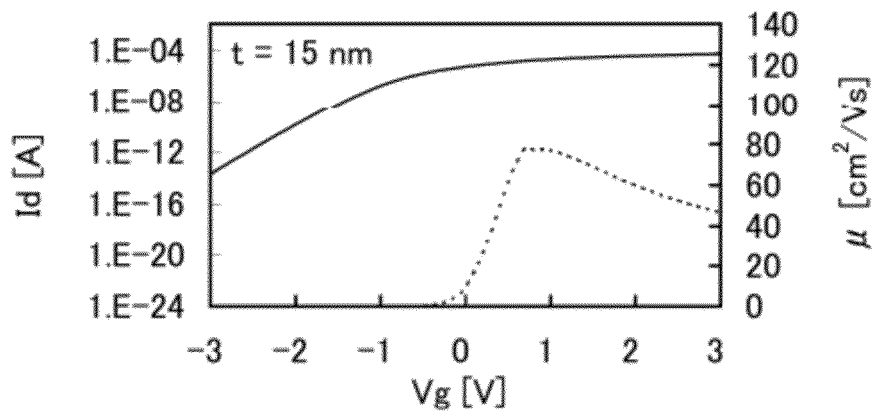
FIGS. 12A to 12C each show the gate voltage dependence of drain current and mobility obtained by calculation.
Figure 12B:
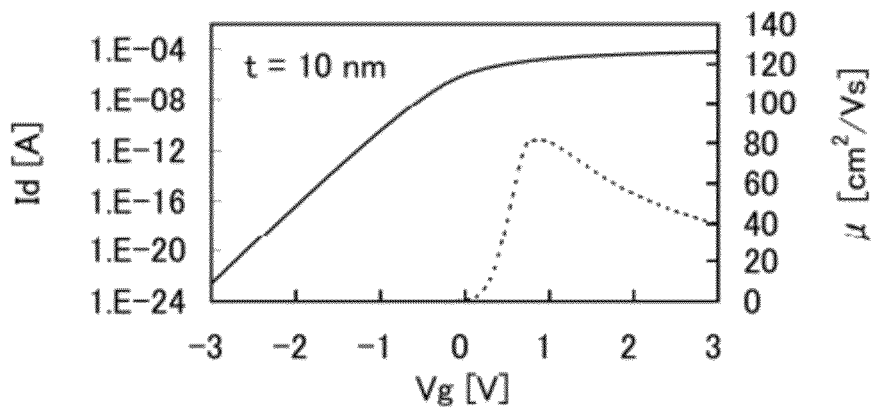
Figure 12C:
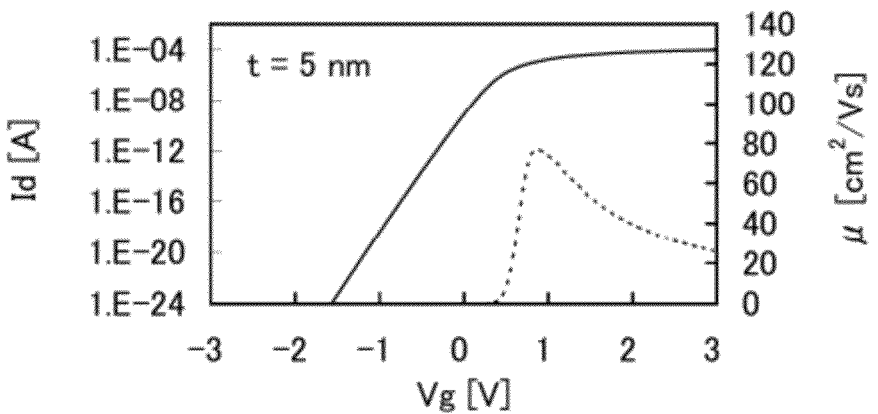

The other parameters used in calculation are as described above. For the calculation, device simulation software Sentaurus Device manufactured by Synopsys, Inc. was used. FIGS. 12A to 12C show the gate voltage ($V_g$: a potential difference between a source and a gate when the potential of the source is used as a reference potential) dependence of the drain current ($I_d$, a solid line) and the mobility ($\mu$, a dotted line) of the transistor having the structure illustrated in FIG. 15A. The drain current $I_d$ is obtained by calculation under the assumption that the drain voltage (a potential difference between the drain and the source) is +1 V, and the mobility $\mu$ is obtained by calculation under the assumption that the drain voltage is +0.1 V.

FIG. 12A shows the gate voltage dependence of the transistor in the case where the thickness of the gate insulator is 15 nm, FIG. 12B shows that of the transistor in the case where the thickness of the gate insulator is 10 nm, and FIG. 12C shows that of the transistor in the case where the thickness of the gate insulator is 5 nm. As the gate insulating film is thinner, the drain current $I_d$ (off-state current) particularly in an off state is significantly decreased. In contrast, there is no noticeable change in the peak value of the mobility $\mu$ and the drain current $I_d$ (on-state current) in an on state. The graphs show that the drain current exceeds 10 µA, which is required in a memory element and the like, at a gate voltage of around 1 V.

Figure 13A:
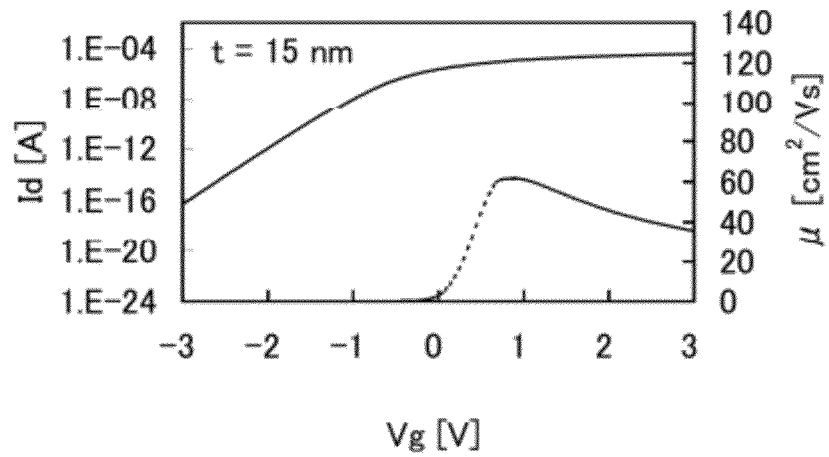
FIGS. 13A to 13C each show the gate voltage dependence of drain current and mobility obtained by calculation.
Figure 13B:
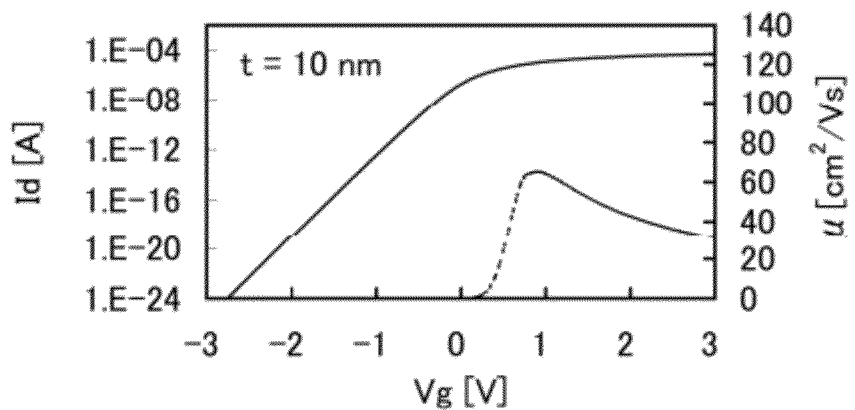
Figure 13C:
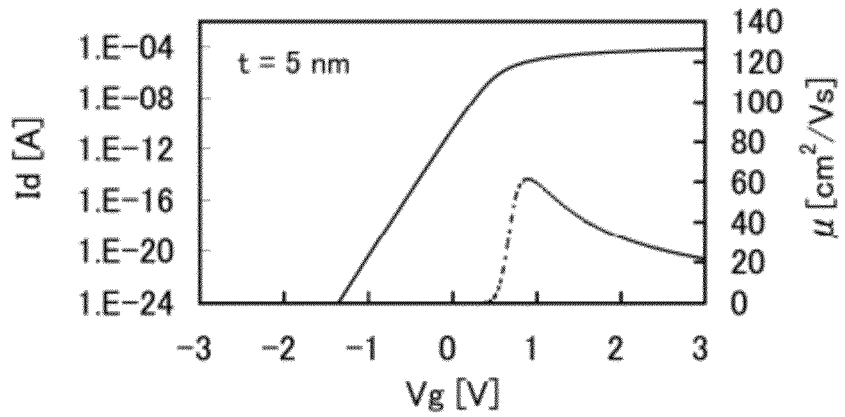

FIGS. 13A to 13C show the gate voltage $V_g$ dependence of the drain current $I_d$ (a solid line) and the mobility $\mu$ (a dotted line) of the transistor having the structure in FIG. 15B and an offset length $L_{off}$ of 5 nm. The drain current $I_d$ is obtained by calculation under the assumption that the drain voltage is +1 V and the mobility $\mu$ is obtained by calculation under the assumption that the drain voltage is +0.1 V. FIG. 13A shows the gate voltage dependence of the transistor in the case where the thickness of the gate insulator is 15 nm, FIG. 13B shows that of the transistor in the case where the thickness of the gate insulator is 10 nm, and FIG. 13C shows that of the transistor in the case where the thickness of the gate insulator is 5 nm.

Figure 14A:
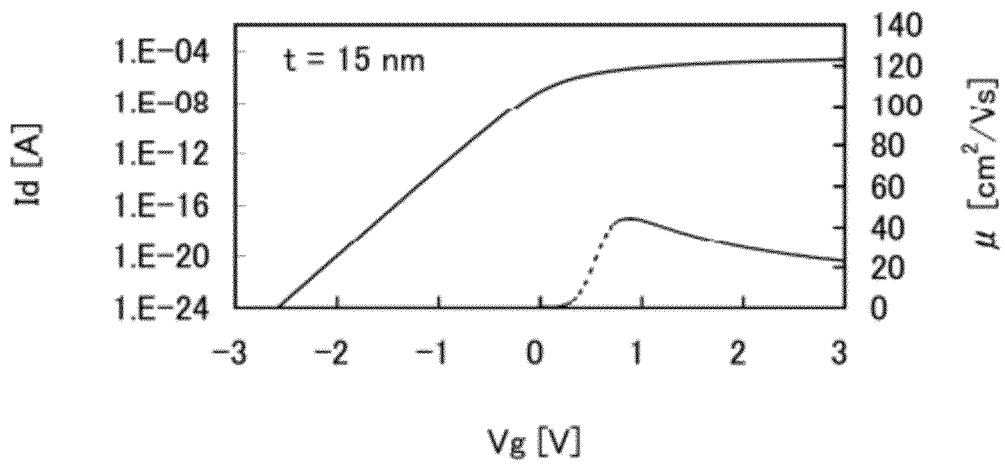
FIGS. 14A to 14C each show the gate voltage dependence of drain current and mobility obtained by calculation.
Figure 14B:
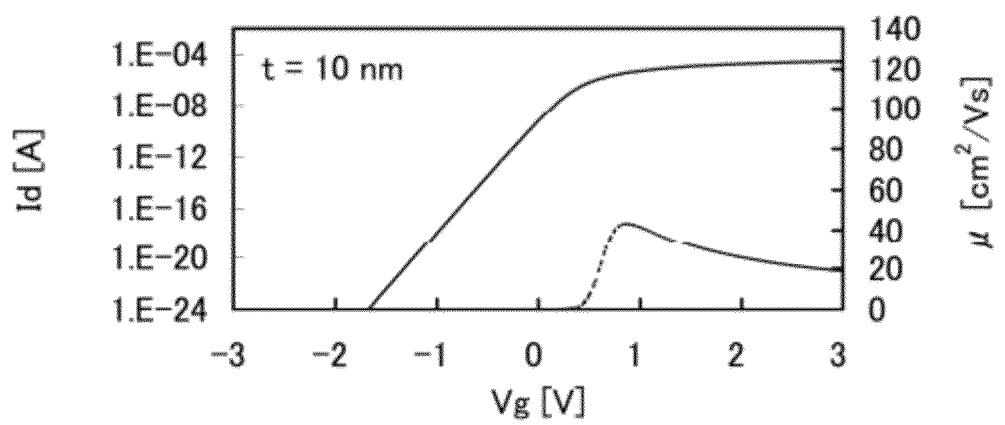
Figure 14C:
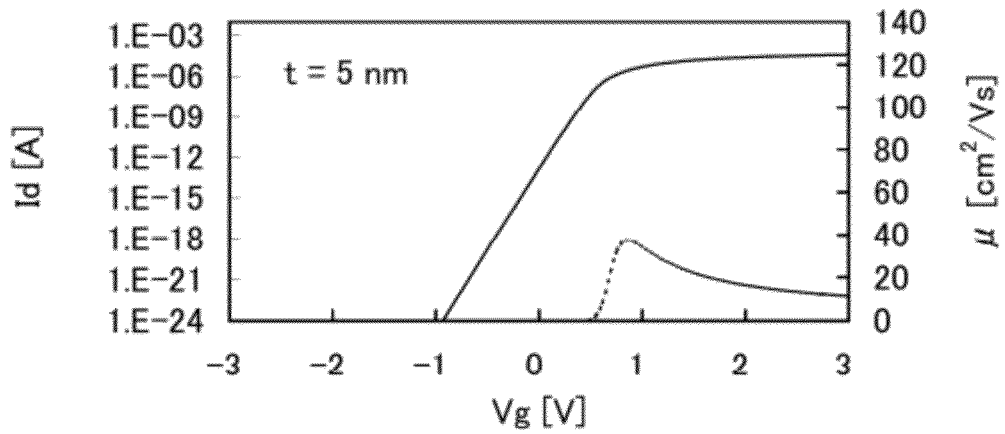
Figure 15A:
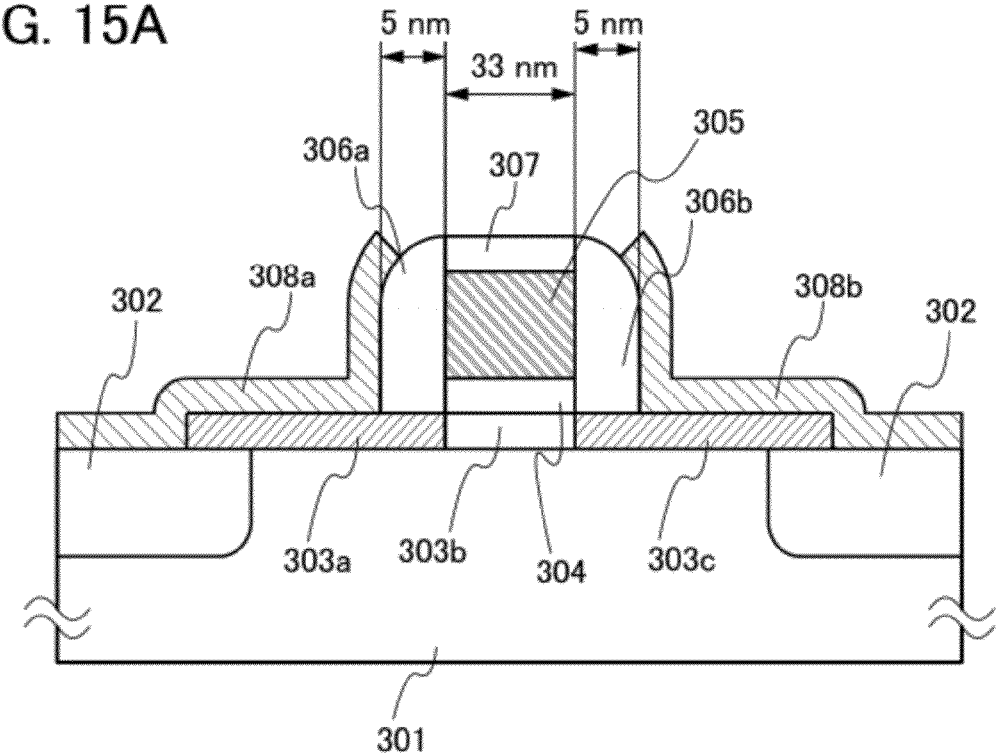
FIGS. 15A and 15B each illustrate a cross-sectional structure of a transistor used for calculation.
Figure 15B:
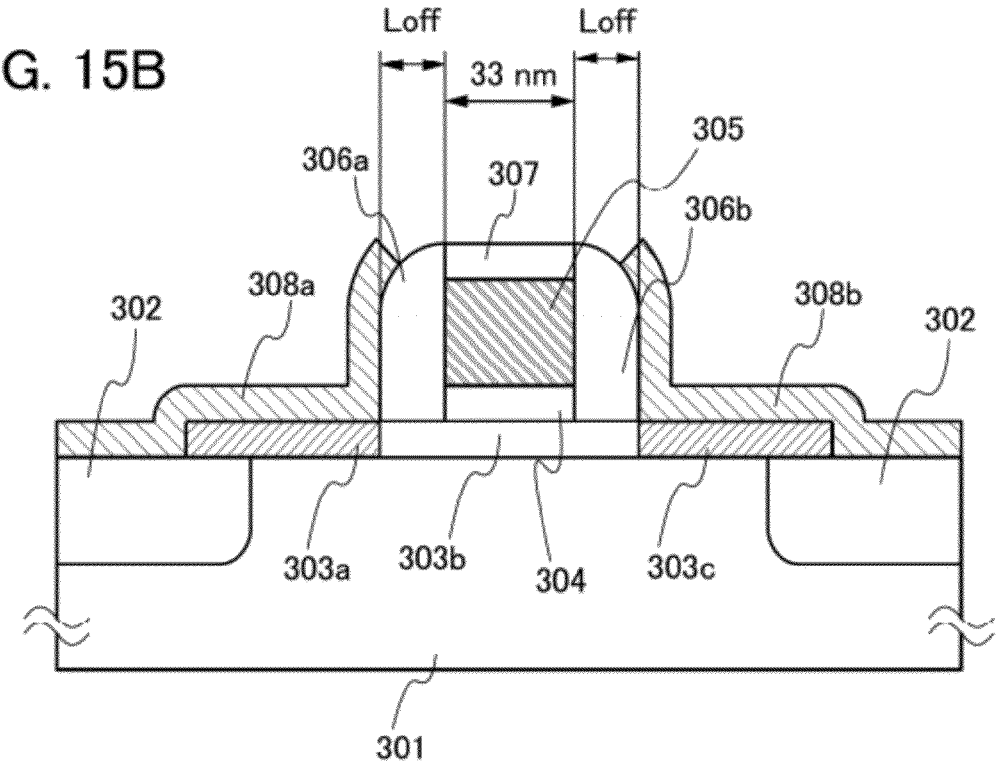

Further, FIGS. 14A to 14C show the gate voltage $V_g$ dependence of the drain current $I_d$ (a solid line) and the mobility $\mu$ (a dotted line) of the transistor having the structure illustrated in FIG. 15B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 14A shows the gate voltage $V_g$ dependence of the transistor in the case where the thickness of the gate insulating layer is 15 nm, FIG. 14B shows that of the transistor in the case where the thickness of the gate insulating layer is 10 nm, and FIG. 14C shows that of the transistor in the case where the thickness of the gate insulating layer is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 12A to 12C, approximately 60 cm$^2$/Vs in FIGS. 13A to 13C, and approximately 40 cm$^2$/Vs in FIGS. 14A to 14C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 µA, which is required in a memory element and the like, at a gate voltage of around 1 V.

As described above, an OS transistor as a wide band gap semiconductor can have very high mobility.

Note that at least one of conductive layers which function as the scan line and the signal line are formed is preferably formed of copper because the resistance of the wiring can be low.

Note that the transistor explained as a wide band gap semiconductor transistor is just an example. The wide band gap semiconductor transistor is not limited thereto and can have various structures.

This application is based on Japanese Patent Application serial no. 2011-103713 filed with Japan Patent Office on May 6, 2011, the entire contents of which are hereby incorporated by reference.

What is claimed is:

1. A semiconductor device comprising:
   a switching element and a transistor;
   a word line electrically connected to a gate of the switching element;
   a bit line electrically connected to one of a source and a drain of the switching element;
   a gate of the transistor electrically connected to the word line; and
   a source and a drain of the transistor electrically connected to a signal generation circuit,
   wherein the transistor serves as a capacitor when potentials of the source and the drain of the transistor are controlled by the signal generation circuit.

2. The semiconductor device according to claim 1,
   wherein a minority carrier is not substantially included in a channel formation region of the transistor.

3. The semiconductor device according to claim 1,
   wherein the transistor comprises a wide band gap semiconductor material in a channel formation region, and
   wherein a band gap of the wide band gap semiconductor material is larger than or equal to 2.0 eV and smaller than or equal to 3.5 eV.

4. The semiconductor device according to claim 1,
   wherein the transistor comprises an oxide semiconductor material in a channel formation region.

5. The semiconductor device according to claim 1, further comprising:
   a wiring,
   wherein the wiring is electrically connected to the source and the drain of the transistor.

6. The semiconductor device according to claim 1, further comprising:
   an adjacent transistor; and
   a wiring,
   wherein a gate of the adjacent transistor is electrically connected to the word line, and
   wherein the wiring is electrically connected to the source and the drain of the transistor and a source and a drain of the adjacent transistor.

7. The semiconductor device according to claim 1, further comprising:
   a capacitor element connected to the other of the source and the drain of the switching element,
   wherein data is stored to the capacitor element.

8. A semiconductor device comprising:
   a switching element and a transistor;
   a word line electrically connected to a gate of the switching element;

a bit line electrically connected to one of a source and a drain of the switching element;
a source and a drain of the transistor electrically connected to the word line; and
a gate of the transistor electrically connected to a signal generation circuit,
wherein the transistor serves as a capacitor when a potential of the gate of the transistor are controlled by the signal generation circuit.

9. The semiconductor device according to claim 8,
wherein a minority carrier is not substantially included in a channel formation region of the transistor.

10. The semiconductor device according to claim 8,
wherein the transistor comprises a wide band gap semiconductor material in a channel formation region, and
wherein a band gap of the wide band gap semiconductor material is larger than or equal to 2.0 eV and smaller than or equal to 3.5 eV.

11. The semiconductor device according to claim 8,
wherein the transistor comprises an oxide semiconductor material in a channel formation region.

12. The semiconductor device according to claim 8, further comprising:
a wiring,
wherein the wiring is electrically connected to the source and the drain of the transistor.

13. The semiconductor device according to claim 8, further comprising:
an adjacent transistor; and
a wiring,
wherein a source and a drain of the adjacent transistor is electrically connected to the word line, and
wherein the wiring is electrically connected to the source and the drain of the transistor and the source and the drain of the adjacent transistor.

14. The semiconductor device according to claim 8, further comprising:
a capacitor element connected to the other of the source and the drain of the switching element,
wherein data is stored to the capacitor element.

15. A semiconductor device comprising:
a plurality of storage elements, each of the plurality of storage elements comprising a switching element and a transistor;
a word line electrically connected to a gate of the switching element;
a bit line electrically connected to one of a source and a drain of the switching element;
a gate of the transistor electrically connected to the word line; and
a source and a drain of the transistor electrically connected to a signal generation circuit,
wherein the transistor serves as a capacitor when potentials of the source and the drain of the transistor are controlled by the signal generation circuit.

16. The semiconductor device according to claim 15,
wherein a minority carrier is not substantially included in a channel formation region of the transistor.

17. The semiconductor device according to claim 15,
wherein the transistor comprises a wide band gap semiconductor material in a channel formation region, and
wherein a band gap of the wide band gap semiconductor material is larger than or equal to 2.0 eV and smaller than or equal to 3.5 eV.

18. The semiconductor device according to claim 15,
wherein the transistor comprises an oxide semiconductor material in a channel formation region.

19. The semiconductor device according to claim 15, further comprising:
a wiring,
wherein the wiring is electrically connected to the source and the drain of the transistor.

20. The semiconductor device according to claim 15, further comprising:
an adjacent transistor; and
a wiring,
wherein a gate of the adjacent transistor is electrically connected to the word line, and
wherein the wiring is electrically connected to the source and the drain of the transistor and a source and a drain of the adjacent transistor.

21. The semiconductor device according to claim 15, further comprising:
a first group comprising the plurality of storage elements;
a second group comprising the plurality of storage elements; and
a precharging and amplification circuit including a sense amplifier and electrically connected to the bit line,
wherein the precharging and amplification circuit is electrically connected to the first group comprising the plurality of storage elements and the second group comprising the plurality of storage elements, and
wherein each of the first group and the second group contains the same number of the plurality of storage elements.

22. The semiconductor device according to claim 15, further comprising:
a capacitor element connected to the other of the source and the drain of the switching element,
wherein data is stored to the capacitor element.

23. A semiconductor device comprising:
a plurality of storage elements, each of the plurality of storage elements comprising a switching element and a transistor;
a word line electrically connected to a gate of the switching element;
a bit line electrically connected to one of a source and a drain of the switching element;
a source and a drain of the transistor electrically connected to the word line; and
a gate of the transistor electrically connected to a signal generation circuit,
wherein the transistor serves as a capacitor when a potential of the gate of the transistor are controlled by the signal generation circuit.

24. The semiconductor device according to claim 23,
wherein a minority carrier is not substantially included in a channel formation region of the transistor.

25. The semiconductor device according to claim 23,
wherein the transistor comprises a wide band gap semiconductor material in a channel formation region, and
wherein a band gap of the wide band gap semiconductor material is larger than or equal to 2.0 eV and smaller than or equal to 3.5 eV.

26. The semiconductor device according to claim 23,
wherein the transistor comprises an oxide semiconductor material in a channel formation region.

27. The semiconductor device according to claim 23, further comprising:
a wiring,
wherein the wiring is electrically connected to the source and the drain of the transistor.

28. The semiconductor device according to claim 23, further comprising:
an adjacent transistor; and
a wiring,
wherein a source and a drain of the adjacent transistor is electrically connected to the word line, and
wherein the wiring is electrically connected to the source and the drain of the transistor and the source and the drain of the adjacent transistor.

29. The semiconductor device according to claim 23, further comprising:
a first group comprising the plurality of storage elements;
a second group comprising the plurality of storage elements; and
a precharging and amplification circuit including a sense amplifier and electrically connected to the bit line,
wherein the precharging and amplification circuit is electrically connected to the first group comprising the plurality of storage elements and the second group comprising the plurality of storage elements, and
wherein each of the first group and the second group contains the same number of the plurality of storage elements.

30. The semiconductor device according to claim 23, further comprising:
a capacitor element connected to the other of the source and the drain of the switching element,
wherein data is stored to the capacitor element.

* * * * *